United States Patent
Cornett et al.

(10) Patent No.: US 6,734,762 B2
(45) Date of Patent: May 11, 2004

(54) MEMS RESONATORS AND METHOD FOR MANUFACTURING MEMS RESONATORS

(75) Inventors: Kenneth D. Cornett, Coral Springs, FL (US); Feng Niu, Weston, FL (US)

(73) Assignee: Motorola, Inc., Schaumburg, IL (US)

( * ) Notice: Subject to any disclaimer, the term of this patent is extended or adjusted under 35 U.S.C. 154(b) by 201 days.

(21) Appl. No.: 09/828,431

(22) Filed: Apr. 9, 2001

(65) Prior Publication Data

US 2002/0145489 A1 Oct. 10, 2002

(51) Int. Cl.$^7$ .............................. H03H 9/46; H03H 9/05; H03H 9/24

(52) U.S. Cl. ..................... 333/186; 333/200; 257/415

(58) Field of Search ............................... 333/186–192, 333/197, 200; 310/322, 330, 351, 352; 257/414, 415, 417

(56) References Cited

U.S. PATENT DOCUMENTS

| | | | |
|---|---|---|---|
| 3,490,056 A | * 1/1970 | Warren et al. | 333/186 |
| 3,614,678 A | * 10/1971 | Engeler et al. | 333/187 |
| 3,634,787 A | * 1/1972 | Newell | 333/186 |
| 6,118,164 A | * 9/2000 | Seefeldt et al. | 257/417 |
| 6,249,073 B1 | * 6/2001 | Nguyen et al. | 310/309 |
| 6,489,864 B2 | * 12/2002 | Frey et al. | 333/197 |

FOREIGN PATENT DOCUMENTS

EP  1045 448 A1  10/2000

OTHER PUBLICATIONS

Wang, Kun et al. VHF Free–Free Bean High Q Micromechanical Resonators. Technical Digest, 12$^{th}$ International IEEE Micro Electro Mechanical System Conference, Orlando, Florida Jan. 17–21, 1999, pp. 453–458.

Wang ,Kun et al. VHF Free–Free Bean High Q Micromechanical Resonators. Journal of Microelectromechanical Systems, vol. 9, No. 3, (Sep. 2000), pp 347–359.

Ayazi, Farrokh et al. High Aspect–Ratio Combined Poly and Single–Crystal Silicon (HARPSS) MEMSS Technology, Journal of Microelectromechanical Systems, vol., 9, No. 3 (Sep. 2000), pp 288–294.

Web page entitled New Developments in Canon ELTRAN SOI Wafer Technology, http://www.usa.canon.com/indtech/semicondeg/news_developments.html, printed Mar. 21, 2001 (6 pages).

Flandre, Denis, Coligne, Jean Pierre, Status and Trends of SOI, http://www.dice.ucl.ac.be/%7Eflandre/ESSCIRC94/ESSCIRC94.html, printed on Mar. 21, 2001 (11 pages).

Goselle, U, Tong, Q.Y. Science and Technology of Semiconductor Wafer Bonding (Tentative) Chapter 7, http://www.duke.ed/web/wbl/ch7/ch7–hpge.html, printed Mar. 20, 2001 (28 pages) [Table of Contents, 11 pages].

* cited by examiner

*Primary Examiner*—Barbara Summons

(57) ABSTRACT

A first type of MEMS resonator adapted to be fabricated on a SOI wafer is provided. A second type of MEMS resonator that is fabricated using deep trench etching and occupies a small area of a semiconductor chip is taught. Overtone versions of the resonators that provide for differential input and output signal coupling are described. In particular resonators suited for differential coupling that are physically symmetric as judged from center points, and support antisymmetric vibration modes are provided. Such resonators are robust against signal noise caused by jarring. The MEMS resonators taught by the present invention are suitable for replacing crystal oscillators, and allowing oscillators to be integrated on a semiconductor chip. An oscillator using the MEMS resonator is also provided.

18 Claims, 18 Drawing Sheets

2ND RESIST EXPOSURE
(FOR SILICON ETCH)

DEVELOPED RESIST

ETCHED SILICON LAYER
SECTIONAL ELEVATION

ETCHED SILICON-PLAN VIEW

3RD RESIST EXPOSURE
(FOR SIO2 ETCH)

DEVELOPED RESIST

AFTER SIO2 ETCH

MEMS RESONATORS AND METHOD FOR MANUFACTURING MEMS RESONATORS

FIELD OF THE INVENTION

The present invention relates to Microelectromechanical Systems (MEMS). More particularly, the present invention pertains to frequency selective MEMS devices, and methods for manufacturing MEMS devices.

BACKGROUND OF THE INVENTION

Currently, there is an interest in increasing the degree of integration of electronics. Integration has proceeded steadily over the last few decades and achieved remarkable reduction in the physical size occupied by electronic circuits. Semiconductor lithography, has enabled circuits with millions of transistors to be constructed on a single silicon die. Nonetheless, certain components are difficult to integrate.

For example, inductors are difficult to integrate Although certain spiral shaped designs for integrated circuits have been proposed, owing to their inherent resistive losses, these spiral inductors are ill suited for producing high Q resonators which are needed to generate stable frequency signal sources.

One important component that is used to generate stable frequencies in a variety of electronic apparatus including sequential logic (e.g., microprocessors) and wireless communication transceivers is the quartz crystal resonator. The quartz crystal resonator in its usual form is a bulky discrete component.

Microelectromechanical System (MEMS) based resonators have been proposed as an alternatives to quartz resonators for use as frequency selective components for use at RF frequencies. One type of MEMS resonator that has been proposed comprises a suspended beam of semiconductor material that is shaped and sized to resonate at a selected frequency chosen in view of a desired electrical frequency response. The MEMS resonator serves as a frequency selective component in a circuit. According to one design the MEMS resonator is driven by a drive electrode that extends below the suspended beam. Electric force interaction between the suspended beam and the drive electrode induces the suspended beam to vibrate.

Although a MEMS resonator occupies very little space compared to an external discrete component it does take up substantial space compared to electrical components found on integrated circuits. A single MEMS resonator can take up space on a semiconductor die that could have been used for tens of transistors. In some applications it would be advantageous to be able to reduce the die area occupied by a MEMS resonator.

Another drawback of suspended beam type MEMS resonators is that they are susceptible to shock and vibration. External shock and vibration will cause spurious electrical signals to be generated by beam type MEMS resonators.

During the past decade there has been an increased interest in the semiconductor industry in use of Silicon On Insulator (SOI) wafers. SOI wafers include a silicon substrate, a silicon di-oxide layer on the silicon substrate, and a single crystal silicon layer on the silicon di-oxide layer. SOI wafers afford a number of advantages in terms of the electrical properties of circuits built using them, including reduced voltage requirements, and power consumption for a given clock speed.

It would be advantageous to have a MEMS resonator design that is especially suited for implementation on a SOI wafer.

The electrical impedance of a beam type MEMS resonator is determined by its geometry. It would also be advantageous for some applications, to be able to provide a MEMS resonator having reduced impedance.

DETAILED DESCRIPTION OF THE PREFERRED EMBODIMENT

Figure 1:
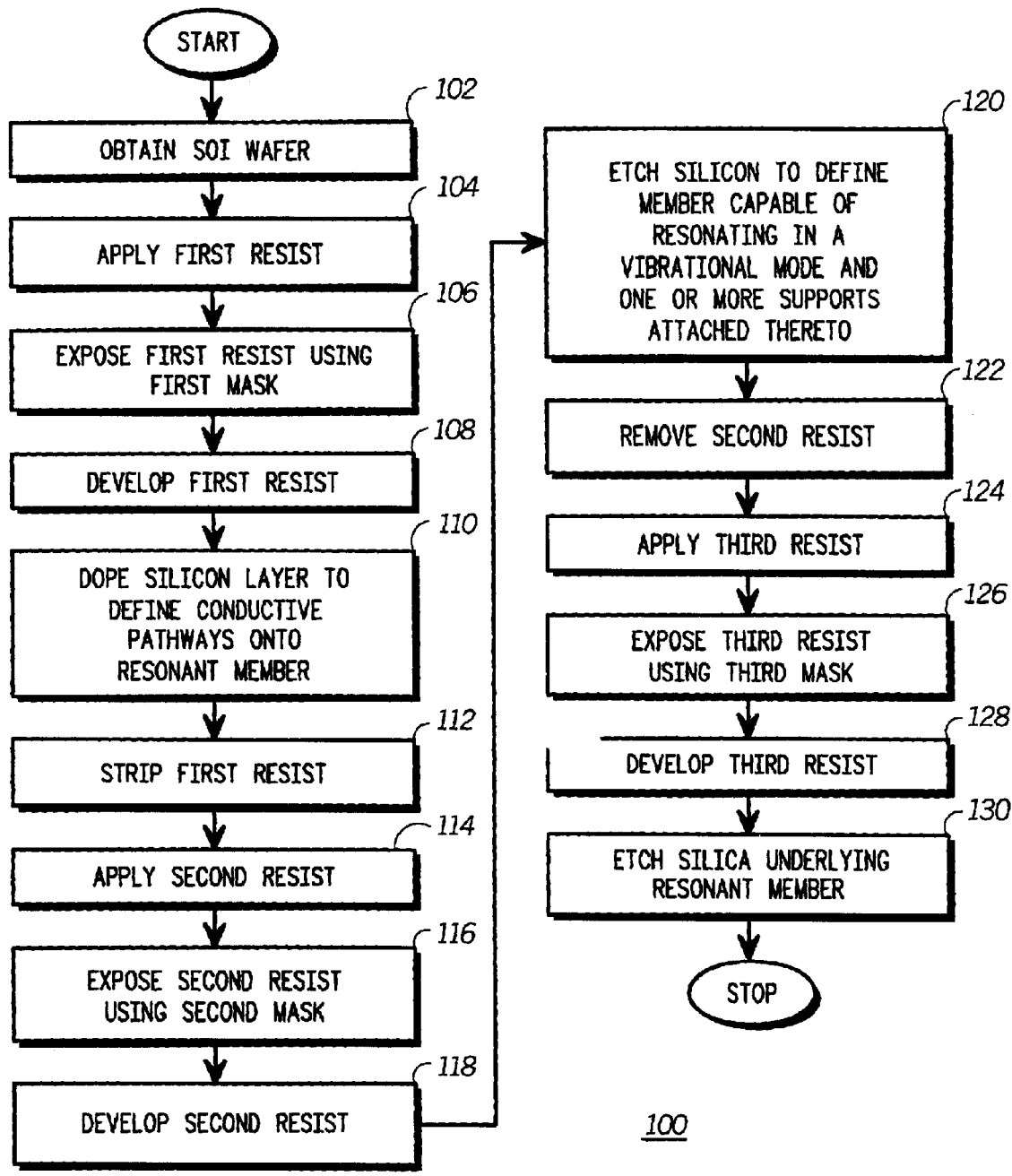
FIG. 1 is a flow chart of a process for manufacturing a MEMS resonator on a SOI wafer according to a preferred embodiment of the invention.

While this invention is susceptible of embodiment in many different forms, there are shown in the drawings and will herein be described in detail specific embodiments, with the understanding that the present disclosure is to be considered as an example of the principles of the invention and not intended to limit the invention to the specific embodiments shown and described. Further, the terms and words used herein are not to be considered limiting, but rather merely descriptive. In the description below, like reference numbers are used to describe the same, similar, or corresponding parts in the several views of the drawings.

According to certain preferred embodiments of the present invention a MEMS resonator design and method of manufacture are provided that are especially suited to implementation on a SOI wafer. The design requires only the silicon layer normally present on the surface of a SOI wafer for construction of the basic resonator device-it does not require doping of the underlying substrate to provide electrically active areas, or deposition of additional semiconductor layers. Thus in combination with the inherent advantages of SOI which are well suited to making low power consumption devices, the SOI MEMS resonator taught by the present invention opens up the possibility of making highly integrated low power electronic devices at low cost. The combination of low cost and low power will enable the further proliferation of electronic devices (e.g., low cost wireless communication devices).

According to other embodiments of the invention a MEMS resonator design that requires very little area on a silicon die is provided. By reducing the area required for a die for a given device, the number of die that can be fit on a wafer can be increased, and the cost per device can be decreased proportionately.

FIG. 1 is a flow chart of a process 100 for manufacturing a MEMS resonator on a SOI wafer according to a preferred embodiment of the invention.

In step 102 a SOI wafer is obtained. SOI wafers can be produced using a number of manufacturing processes including the UNIBOND™ process, the Separation by Implantation with Oxygen (SIMOX), and the Bond and Etch Back Silicon on Insulator (BESOI) process. These processes are described below in further detail. SOI wafers are available commercially. In carrying out the invention SOI wafers would likely be obtained commercially and not produced in-house. UNIBOND™ SOI wafers are available commercially from SOITEC USA of Peabody, Mass. SIMOX SOI wafers are available from IBIS corporation of Danvers, Mass.

Figure 2:
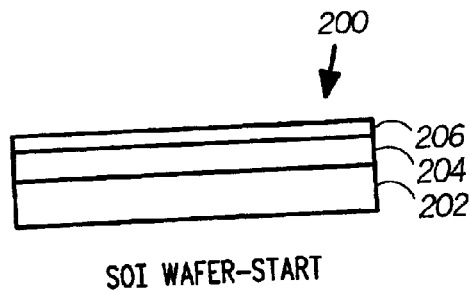
FIG. 2 is a sectional elevation view of a SOI wafer used in the process shown in FIG. 1.

FIG. 2 is a sectional elevation view of a SOI wafer 200 used in the process shown in FIG. 1. (Note that due to the differences in scale between wafers and devices fabricated thereon, the sectional elevation views shown in the figures are not draw to scale.) The SOI wafer 200 comprises a silicon base layer 202, an silicon di-oxide layer 204 born on the silicon base layer 202, and a single crystal silicon (device) layer 206 born on the oxide layer 204. The single crystal silicon layers 206 on SOI wafers 200 have a low residual stress. This property is used to advantage in the present invention in which resonator beams can be etched out of the silicon layer 206 without ensuing deformation due to residual stress. Due to the lack of residual stress in the silicon layer 206 lengthy annealing prior to etching is not be required. However, annealing may be performed as part of the process of manufacturing the SOI wafer 200.

Referring again to FIG. 1 in step 104 a resist 302 (FIG. 3) is applied to the SOI wafer 200. In a commercial implementation the resist would likely be a photoresist that is suited to UV or X-ray exposure. For prototyping an e-beam resist and e-beam resist patterning is preferred. If needed the resist can be softbaked after it has been applied to evaporate a portion of a solvent component of the resist.

Figure 3:
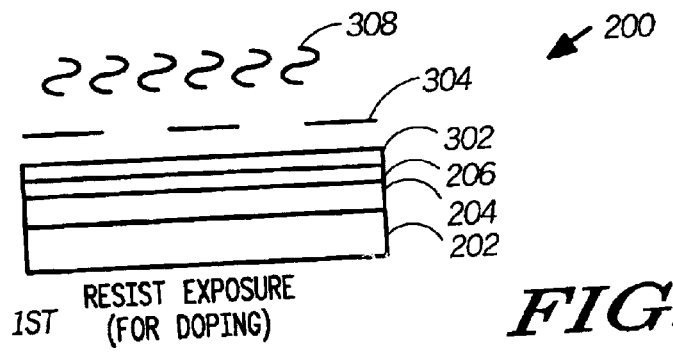
FIG. 3 is a sectional elevation view of the SOI wafer shown in FIG. 2 during a first resist exposure operation.

In step 106 the first resist 302 (FIG. 3) is exposed using a first mask 304 (FIG. 3). The first mask 304 (FIG. 3) determines a pattern of doping of the single crystal silicon layer 206.

FIG. 3 is a sectional elevation view of the SOI wafer 200 shown in FIG. 2 during a first resist exposure operation. As shown in FIG. 3, the first resist 302 has been applied to the wafer 200. The wafer 200 can be supported on the stage of a stepper (not shown) proximate to a first exposure mask 304. Radiant or corpuscular energy (e.g., ultraviolet, X-ray or free electrons) 308 is used to image the mask 304 onto the resist 302. The mask 304 can for example be a phase shift mask in the case that deep ultraviolet is used.

Referring once again to FIG. 1 in step 108 the first resist 302 (FIG. 3) is developed. Optionally the resist can be hard baked after development in preparation for further processing. In step 110 the silicon layer 206 is doped to define conductive pathways onto a resonant member. Note that at this point in the processing the outline of the resonant member has yet to be etched.

Figure 4:
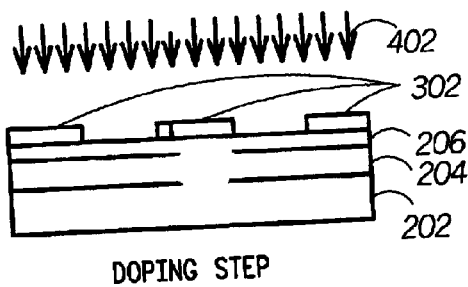
FIG. 4 is a sectional elevation view of the SOI wafer shown in FIG. 3 during a doping operation.

FIG. 4 is a sectional elevation view of the SOI wafer shown in FIG. 3 during a doping operation. In FIG. 4 the resist 302 is shown after development in a patterned state. A flux of dopant species (e.g., atoms or ions) 402 is shown above the wafer. Preferably doping is accomplished using an ion implanter, as that is the tool of choice in modern semiconductor fabrication facilities. Alternatively vapor phase doping in a diffusion furnace can be used.

Figure 5:
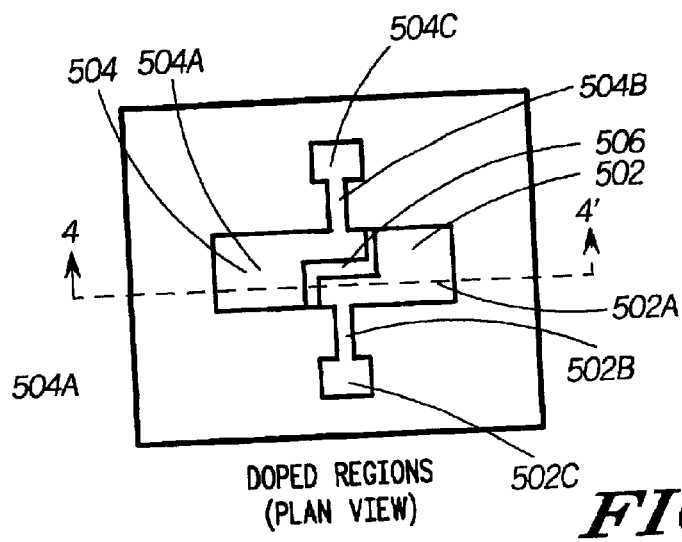
FIG. 5 is a plan view of the SOI wafer shown in FIG. 4 after a doping operation.

FIG. 5 is a plan view of the SOI wafer 200 shown in FIG. 4 after the doping operation. The location of the section plane of FIG. 4 is indicated in FIG. 5. As seen in FIG. 5, after the doping step 110, the SOI wafer 200 includes a first doped region 502, and a second doped region 504 separated by an non-doped insulating (isolating) region 506. The insulating region can have a low conductivity due to a low dopant concentration. The insulating region can have a sufficient dopant to make its conductivity significant, yet still serve as an isolating region if its dopant is opposite in type (e.g. P as opposed to N) to that used in the first 502 and second 504 doped regions. In the latter case isolation is provided by the presence of at least one reversed biased PN junction between the first 502 and second doped regions, for any voltage difference between the two doped regions 502, 504. The first doped region 502 includes a first sub region 502A that in the completed MEMS resonator will be located on a resonating member, an elongated sub region 502B that in the completed MEMS resonator will lie along a support beam. At the end of the elongated sub region is a pad shaped doped sub region 502C that in the completed MEMS resonator will be located on a perimeter ring that will support the support beam. Similarly the second doped region includes corresponding sub-regions 504A, 504B, and 504C.

Figure 6:
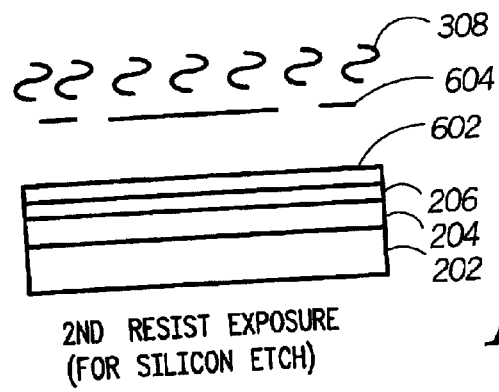
FIG. 6 is a sectional elevation view of the SOI wafer shown in FIG. 5 during a second resist exposure operation.

Referring to FIG. 2 in step 112 the first resist 302 is stripped from the SOI wafer 200, and in step 114 a second resist 602 (FIG. 6) is applied to the SOI wafer 200. In step 116 the second resist 602 is imagewise exposed to corpuscular or radiant energy using a second mask 604 (FIG. 6). The second resist 602 defines a pattern for etching the single crystal silicon 206 layer.

Figure 7:
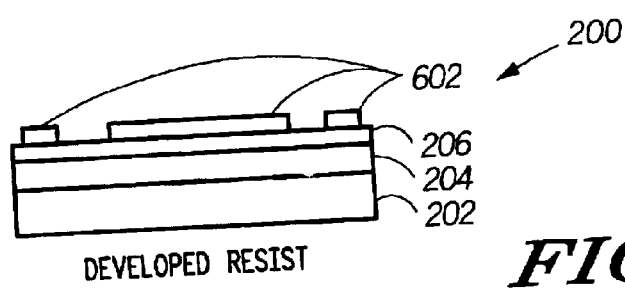
FIG. 7 is a sectional elevation view of the SOI wafer shown in FIG. 6 after a resist development operation.
Figure 8:
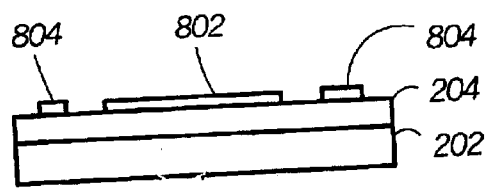
FIG. 8 is a sectional elevation view of the SOI wafer shown in FIG. 7 after a silicon top layer etching operation.

In step 118, the second resist layer 602 (FIG. 6) is developed. The developed second resist layer is shown in FIG. 7. In step 120 the single crystal silicon layer 206 is patternwise etched to define a beam shaped member 802 (FIG. 8) capable of resonating in a vibrational mode and one or more supports attached to the member. FIG. 8 is a sectional elevation view showing the resonating member 802, and a perimeter ring 804 that along with a plurality of support beams (not visible in this view) support the resonating member 802.

Figure 9:
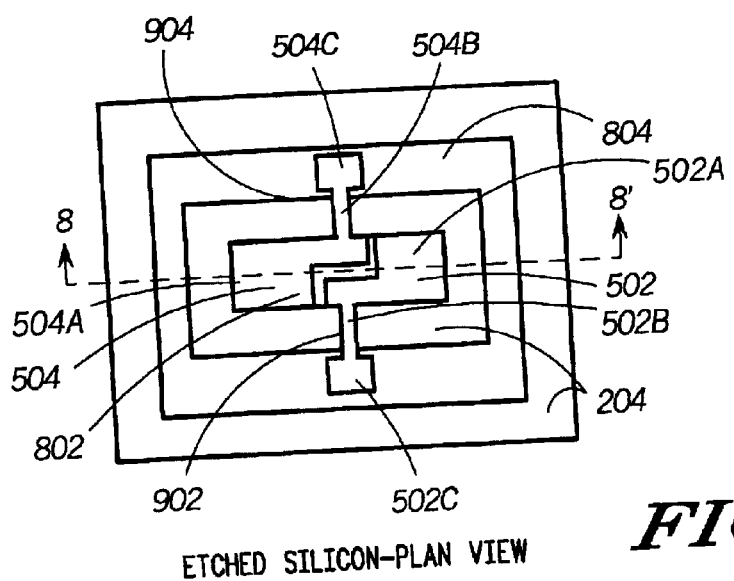
FIG. 9 is a plan view of the SOI wafer shown in FIG. 7 after the silicon top layer etching operation.

FIG. 9 is a plan view of the SOI wafer 200 shown in FIG. 7 after the silicon top layer etching operation. As shown in FIG. 9, the first doped sub region 502A and the second doped sub region 504A are located on the resonating member 802, separated by the isolation region 506. The resonating member 802 is seen to be in the form of an elongated beam. The resonating member 802 is attached to the peripheral ring 804 by two support beams 902, 904 which extend perpendicularly from opposite sides of the resonating beam 802 at its longitudinal center. Conducting sub regions 502A, 504A are on the two support beams 902, 904 respectively. The section plane of FIG. 8 is indicated in FIG. 9.

Figure 10:
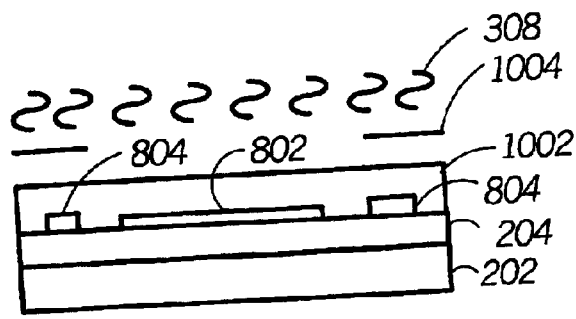
FIG. 10 is a sectional elevation view of the SOI wafer shown in FIG. 9 during a third resist exposure operation.

Referring once again to FIG. 1, in step 122 the second resist 602 (FIG. 6) is removed, and in step 124 a third resist 1002 (FIG. 10) is applied. The third resist 1002 (FIG. 10) is used to define an area for etching the oxide layer 204. In step 126 the third resist 1002 (FIG. 10) is exposed to corpuscular or radiant energy 308 (FIG. 3) using a third mask 1004 (FIG. 10). In step 128 the third resist 1002 (FIG. 10) is developed.

Figure 11:
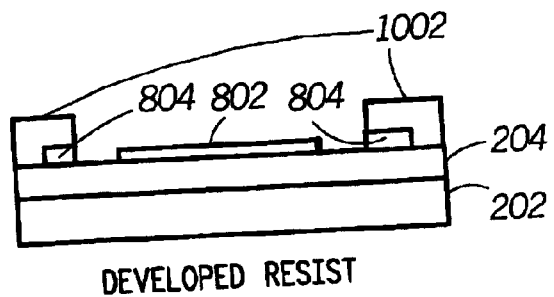
FIG. 11 is a sectional elevation view of the SOI wafer shown in FIG. 10 after a resist development operation.
Figure 12:
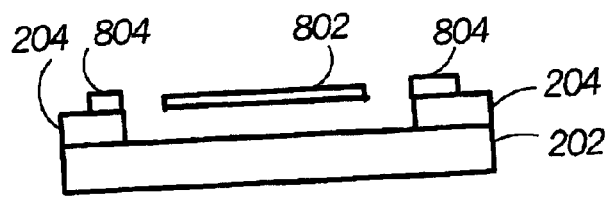
FIG. 12 is a sectional elevation view of the SOI wafer shown in FIG. 11 after an oxide etch operation.

The third resist 1002 (FIG. 10) is shown after development in FIG. 11. In step 130 the oxide 204 under the resonant member 802, (in fact all of the oxide within the perimeter ring 804) is etched in order to free the resonant member for movement. A Buffered Oxide Etch (BOE) solution is suitable for etching the oxide 214. FIG. 12 is a sectional elevation view of the SOI wafer shown in FIG. 11 after an oxide etch operation. The support beams 902, 904 (FIG. 9) that connect the resonant member 802 to the peripheral ring 804 are not visible in this sectional view (taken along the same lines indicated for FIG. 8 in FIG. 9).

Figure 13:
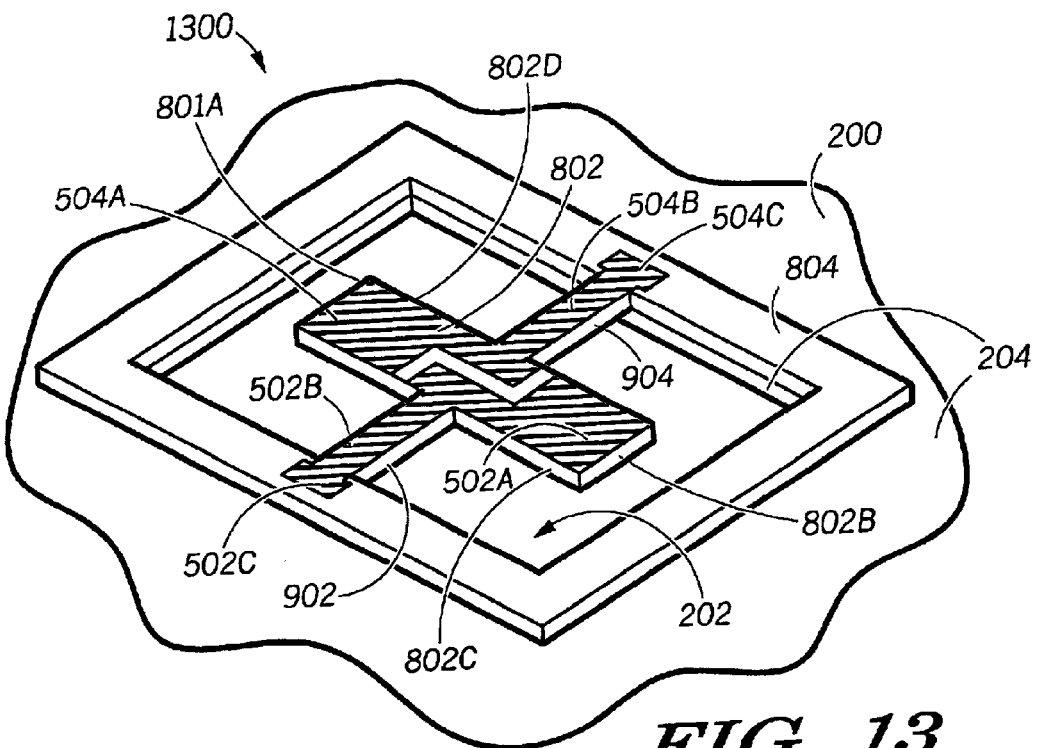
FIG. 13 is a broken out perspective view of a wafer showing the SOI MEMS resonator shown in FIG. 12.

FIG. 13 is a broken out perspective view of the wafer 200 showing the SOI MEMS resonator 1300 fabricated by process 100. The resonant member 802 has a first end 802A, second end 802B, a first peripheral edge 802C extending from the first end 802A to the second end 802B, and a second peripheral edge 802D extending from the first end 802A to the second end 802B. The first 902 and second 904 support beams attached at longitudinal centers of the first 802C and second 802D peripheral edges of the resonant member 802. The first doped region 502 including sub regions 502A, 502B and 502C, and the second doped region 504 including sub regions 504A, 504B and 504C are shown as cross hatched areas. (Doped regions are shown as cross hatched areas in FIGS. 13–16,30,34,36,38–40. Cross hatched areas in other view may represent different regions as described.) Other parts indicated by reference numeral are described above with reference to the foregoing figures.

Figure 14:
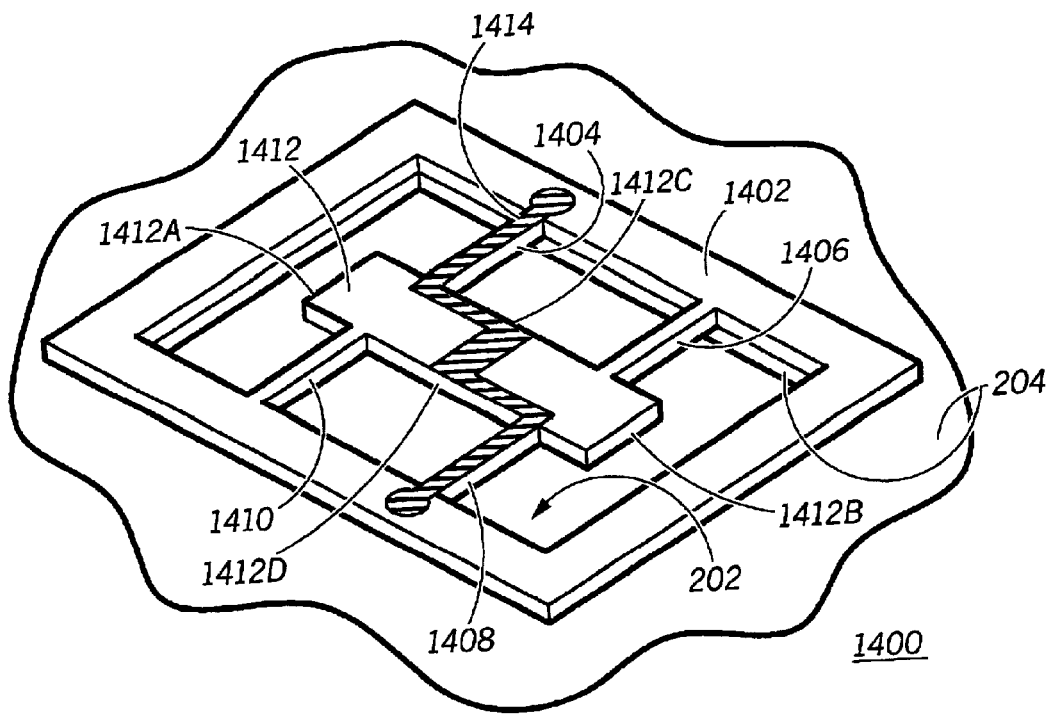
FIG. 14 is a broken out perspective view of a wafer showing a second SOI MEMS resonator according to an embodiment of the invention.

FIG. 14 is a broken out perspective view of a wafer showing a second SOI MEMS resonator 1400 according to a preferred embodiment of the invention.

The MEMS resonator 1400 comprises a peripheral ring 1402 of single crystal silicon 1402 born on a silicon dioxide layer 204. The silicon dioxide layer 204 is borne on an underlying silicon substrate 202. A single crystal silicon beam shaped resonant member 1412 is centered within the peripheral ring 1402. The beam shaped resonant member has a first end 1412A, a second end 1412B, a first longitudinal edge 1412C extending between the first end 1412A, and the second end 1412B, and a second longitudinal edge 1412D extending between the first end 1412A and the second end 1412B. First 1404, second 1406, third 1408, and fourth 1410 support beams extend between the peripheral ring 1402 and the resonant member 1412. The support beams 1404–1410 are perpendicular to the resonant member 1412. The first 1404 and second 1406 support beams attach to the first longitudinal edge 1412C. The third 1408 and fourth 1410 support beams attach the second longitudinal edge 1412D.

The resonant member 1412 has a size and shape chosen so that it is capable of vibrating in a predetermined mode that has first and second nodes equally spaced from and on opposite sides of a longitudinal center of the beam shaped resonant member 1412. The vibrational mode is a one period sinusoidal flexural mode that is symmetric about the longitudinal center of the beam. The first 1404 and fourth 1410 support beams attach to the resonant member 1412 at the position of the first node of the sinusoid. The second 1406 and third 1408 support beams attach to the resonant member 1412 at the position of the second node of the sinusoid. The center of the beam shaped resonant member is an anti-node of the sinusoid.

A doped region (shown as a cross hatched area) 1414 extends from the peripheral ring 1402, along the first support beam 1404 to the beam shaped resonant member 1412, along the first peripheral edge 1412C toward the longitudinal center of the resonant member 1412, across the resonant member 1412 to the second peripheral edge 1412D, along the second peripheral edge 1412D toward the juncture of the third support beam 1408 and the resonant member 1412, and along the third support beams 1408 back onto the peripheral ring 1402. Portions of the doped region 1414 on the peripheral ring can be used to make a connection between the MEMS resonator 1400 and an external circuit (not shown in this view) such as an oscillator circuit that uses the MEMS resonator to set a resonant frequency. The external circuit can be implemented on the SOI die used to fabricate the MEMS resonator. The external circuit can be implemented using standard methods for integrated circuit fabrication. The connection to the external circuit can be made by an ohmic contact between a metallization plug (not shown) and the doped region 1414 e.g. at the peripheral ring 1402.

Figure 15:
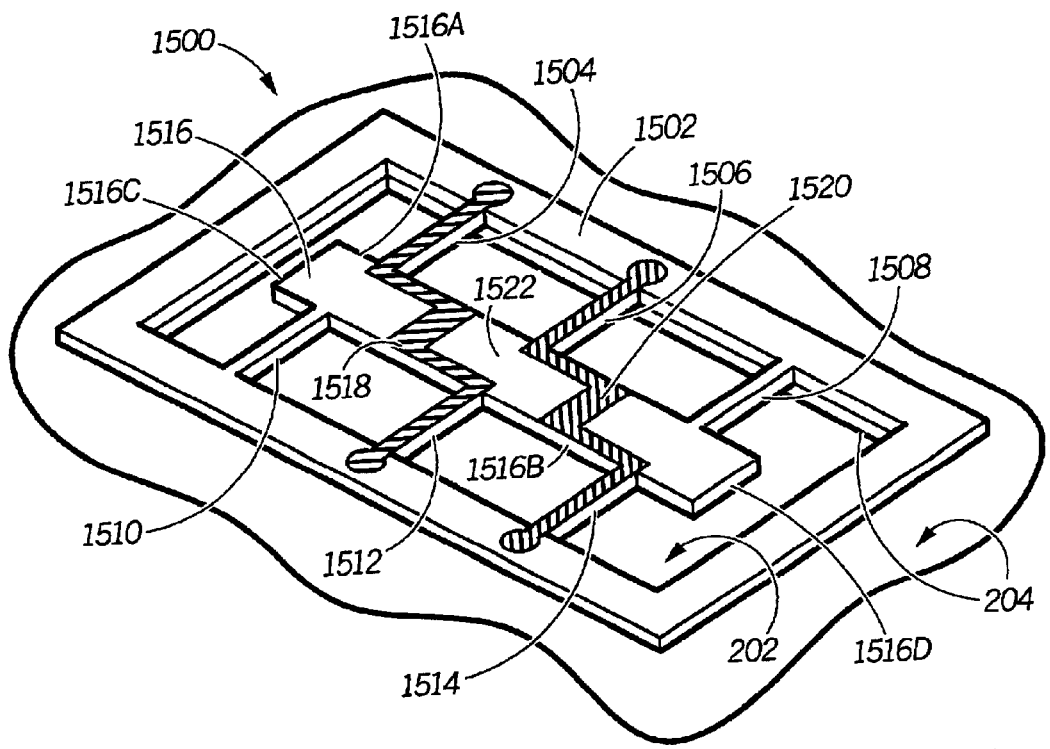
FIG. 15 is a broken out perspective view of a wafer showing a third SOI MEMS resonator according to an embodiment of the invention.

FIG. 15 is a broken out perspective view of a wafer showing a third SOI MEMS resonator 1500 according to an embodiment of the invention. The resonator 1500 includes a beam shaped resonant member 1516. The resonant member 1516 is shaped and sized to vibrate in a one and one-half wavelength sinusoidal flexural beam mode that is antisymmetric as judged from its longitudinal center. The beam mode includes three nodes, one of which is located at the longitudinal center of the beam, and the other two of which are equally spaced from and on opposite sides of the longitudinal center. The beam mode includes four anti-nodes two of which are located between the central node and each of the other two nodes, and two of which are located at first and second ends 1516C, and 1516D of the resonant member 1516. The beam shaped resonant member 1516 has, a first longitudinal edge 1516A extending between the first end 1516C and second end 1516D, and a second longitudinal edge 1516B extending between the first end 1516C and the second end 1516D. A first support beam 1504 is connected to the first longitudinal edge 1516A at the position of a first node. A second support beam 1506 is connected to the first longitudinal edge 1516A at the position of the center node. A third support beam 1508 is connected to the first longitudinal edge 1516A at the position of a third node. Fourth through sixth support beams 1510, 1512, 1514 are connected to the second longitudinal edge at the positions of the first, center, and third nodes respectively. The support beams 1504–1514 extend perpendicularly away from the beam shaped resonant member 1516 to a peripheral ring 1502. The beam shaped resonant member 1516, the peripheral ring 1502, and the support beams 1504–1514 are all made from the top silicon layer 206 of a SOI wafer. Within the peripheral ring 1502, the silicon dioxide layer 204 has been etched away to make room for the resonant member 1516 to vibrate.

A first doped region 1518 extends from the peripheral ring 1502, down the length of the first support beam 1504, onto the resonant member 1516, along the first longitudinal edge 1516A in the direction of its longitudinal center to a first anti-node, across the resonant member 1516 at the first anti-node, to the longitudinal center along the second longitudinal edge 1516B, along the fourth support beam 1512 to the peripheral ring 1502. Similarly, a second doped region 1520 extends from the peripheral ring 1502, down the length of the second support beam 1506, onto the resonant member 1516, along the first longitudinal edge 1516A in the direction of the second end 1516D to a second anti-node, across the resonant member 1516 at the second anti-node, along the second longitudinal edge to the node at which the third 1508 and sixth 1514 support beams are connected, along the sixth support beam 1514 to the peripheral ring 1502. Thus the first doped region crosses the resonant member 1516 at first anti-node adjacent to the longitudinal center of the resonant member 1516, and a second doped region crosses the resonant member at a second anti-node adjacent to the longitudinal center of the resonant member 1516. A non-doped isolation region 1522 is located between the first doped region 1518 and the second doped region 1520.

In as much as the resonant mode of the resonant member 1516 is anti-symmetric as judged from the center of the resonant member, the two anti-nodes at which the first and second doped regions cross the resonant member 1516 have opposite phase (i.e. when one is deflected up the other is deflected down and visa versa). The resonator 1500 can be caused to resonate by applying opposite polarity signals to the two doped regions 1518 and 1520. The resonator can be used a frequency selective circuit element in a positive feedback loop of an oscillator by connecting one side of the circuit (e.g., from the oscillators amplifier output) to the first conductive region 1518 and a second side of the circuit (e.g. the oscillators amplifiers input) to the second conductive region 1520. Connected as describe the resonator 1500 serves a role analogous to that of a quartz crystal resonator.

Figure 16:
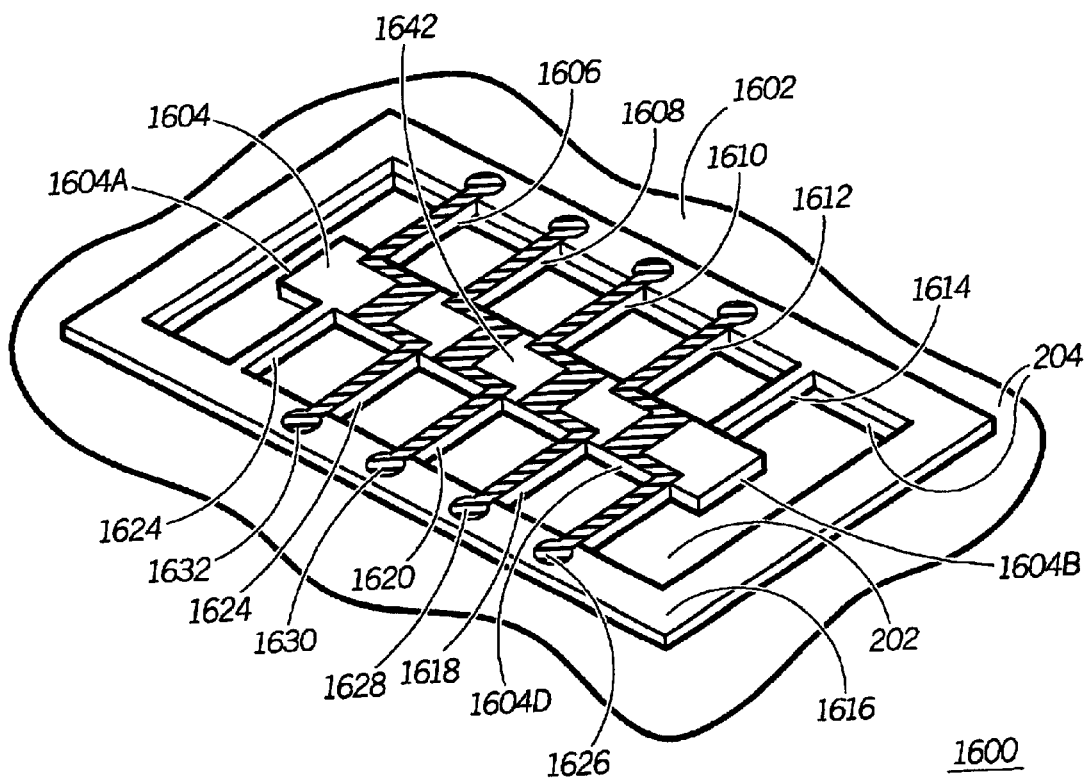
FIG. 16 is a broken out perspective view of a wafer showing a fourth SOI MEMS resonator according to an embodiment of the invention.

FIG. 16 is a broken out perspective view of a SOI wafer showing a fourth SOI MEMS resonator 1600 according to an embodiment of the invention. The fourth resonator 1600 includes a beam shaped resonant member 1604 that is sized and shape to oscillate at a predetermined frequency, in a two and one-half period sinusoid flexural beam mode that is anti-symmetric as judged from a center 1642 of member 1604. The resonant member has a first end 1604A, second end 1604B, a first longitudinal edge 1604C extending between the first end 1604A and the second end 1604B, and a second longitudinal edge 1604D extending between the first end 1604A and the second end 1604B. Five support beams extend perpendicularly from the first longitudinal edge 1604C at positions of nodes of the above mentioned mode. In order, from the first end 1604A to the second end 1604B, the five support beams are identified by reference numerals 1606, 1608, 1610, 1612, and 1614. Similarly five more support beams are attached to the second longitudinal edge 1604D at positions of the nodes. These elements in order from the second end 1604B are labeled by reference numerals 1616, 1618, 1620, 1622, and 1624. The ten support beams 1606–1624 terminate at a peripheral ring 1602. According to an alternative embodiment of the invention one or more support beams at one or more nodes are eliminated. The resonant device 1600 includes four doped regions, 1626, 1628, 1630, and 1632. Each doped region extends from a support beam connected to the first longitudinal edge 1604C over the resonant member 1604, to a support beam connected to the second longitudinal edge 1604D that is offset from the support beam connected to the first longitudinal edge 1604C that shares the same doped region. Each doped region crosses over an anti-node of the resonant mode. Thus four anti-nodes are crossed. Adjacent anti-nodes have opposite phase. Every other anti-node has the same phase. The doped regions that cross over anti-nodes that have the same phase can in some embodiments be advantageously connected to an external circuit (e.g., oscillator) in parallel. That is all the doped regions that cross anti-nodes that have one phase can be connected to one side of the circuit, and all the doped regions that cross over anti-nodes with the opposite phase can be connected to the other side of the circuit. By connecting the anti-nodes to an external circuit in parallel, a lower effective impedance for the resonator is realized. This is particularly important in circuits that require lower impedance circuit elements.

Alternatively, the resonator 1600 can be attached to an external circuit as a delay line. To use the resonator 1600 as a delay line, the two doped conductive regions 1632, 1630 near the first end 1604A can be used as differential signal inputs, and the two doped conductive regions 1628 and 1626 near the second end 1604B can be used as differential signal outputs. Alternatively the doped conductive region 1632 closest to the first end 1604A can be used as a single signal input, and the doped conductive region 1626 near the second end 1604B can be used as a single signal output.

Alternatively one pair of oppositely phased conductive regions e.g., 1626, 1632 can be used as differential inputs of an external circuit, and the other pair of conductive regions e.g., 1628, 1630 can be used as differential outputs or visa versa. In this configuration the effect of jarring of the resonator 1600 on an output signal will be reduced. This is explained as follows. The resonant member is physically symmetric so that its center of gravity is located at its center 1642. The resonant member 1604 resonates in a mode that is anti-symmetric as judged from its center 1642. External jarring will tend to cause the center of the resonant member to deflect up and/or down in a symmetric manner which will cause equal movement of the above mentioned pairs of oppositely phased doped conductive regions. If for example a differential amplifier with a high common mode rejection ration (CMRR) is connected to a pair of oppositely phased doped conductive regions (e.g., 1628, 1630) that are equidistant from the center, the perturbation of the signal caused by the jarring will be rejected by the differential amplifier.

Either for use as a resonator, or as a delay line, the resonator 1600 can be extended so as to resonate in a higher order mode than that shown in FIG. 16.

In each of the embodiments shown in FIGS. 13–16, the peripheral ring 804 (FIGS. 8,13), 1402 (FIG. 14), 1502 (FIG. 15), 1602 (FIG. 16), the resonant member 802 (FIGS. 8,13), 1412 (FIG. 14), 1516 (FIG. 15), 1604 (FIG. 16) and the support beams 902–904 (FIGS. 9,13), 1404–1410 (FIG. 14), 1504–1514 (FIG. 15), 1606–1624 (FIG. 16) are unitary. That is to say that they are all etched from the top silicon layer 206 (FIG. 2) of a SOI wafer 200 (FIG. 2).

Figure 17:
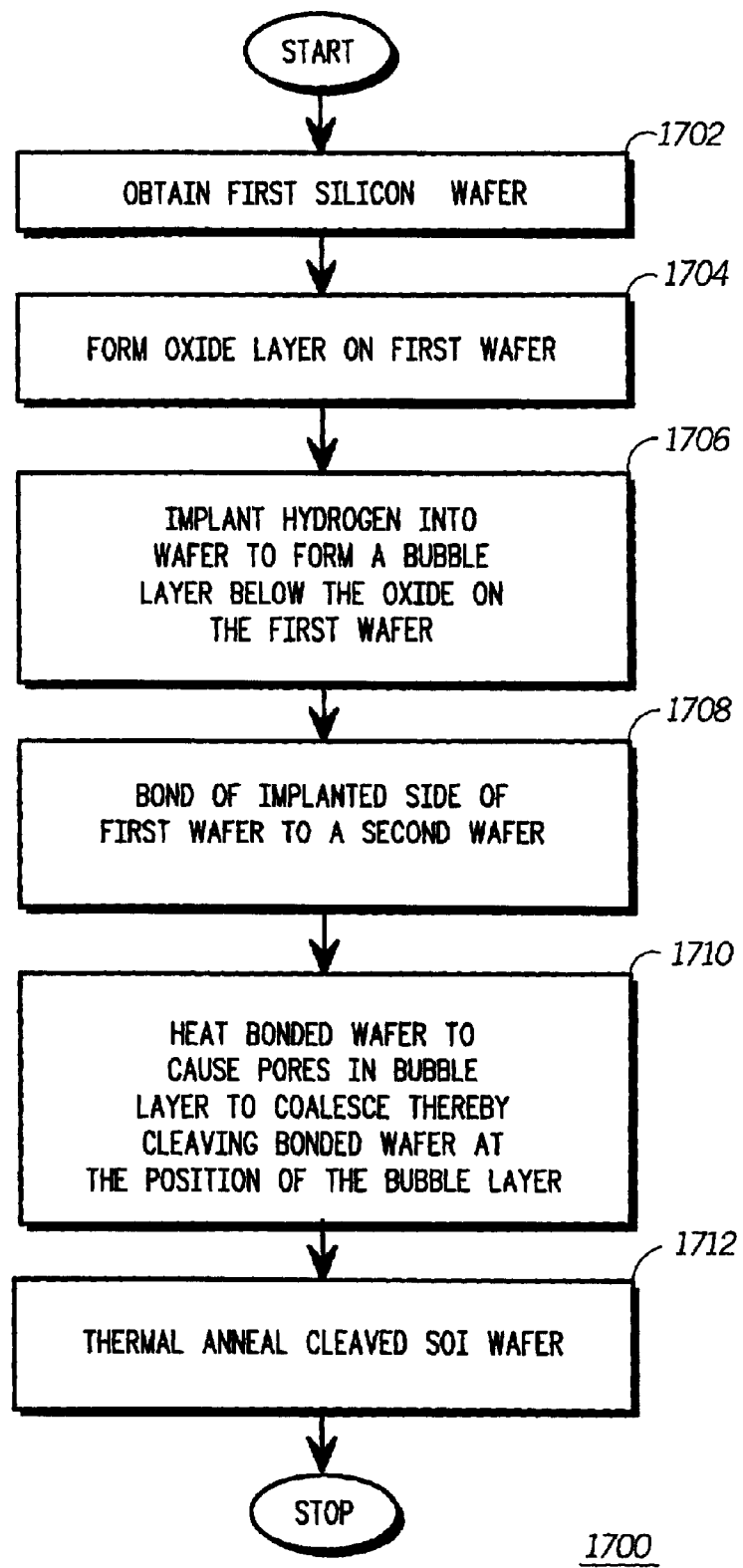
FIG. 17 is a flow chart of a first process of making a SOI wafer.
Figure 18:
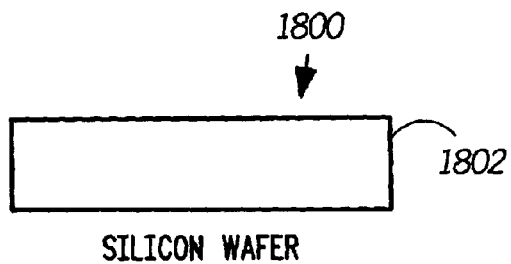
FIG. 18 is a depiction of a silicon wafer used in making a SOI wafer.
Figure 19:
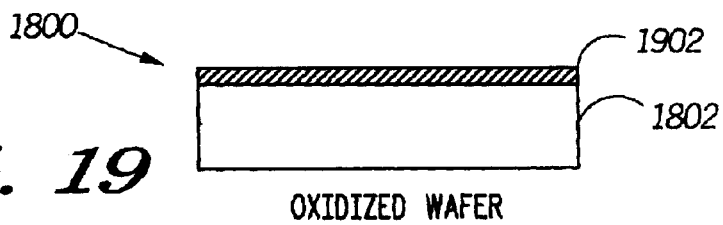
FIG. 19 is a sectional elevation view of the wafer shown in FIG. 18 after an oxide growth step.
Figure 20:
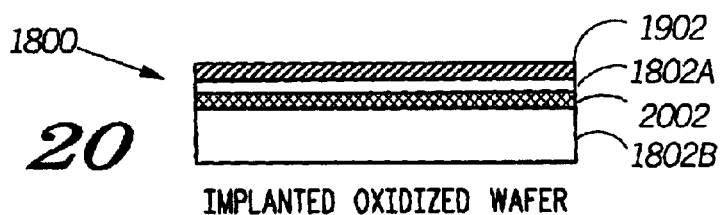
FIG. 20 is a sectional elevation view of the wafer shown in FIG. 19 after a hydrogen implantation step.
Figure 21:
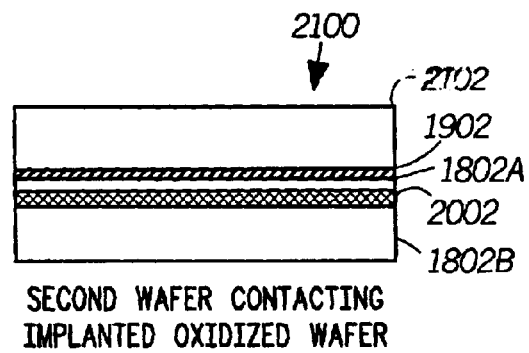
FIG. 21 is a sectional elevation view of the wafer shown in FIG. 20 bonded to a second wafer of the type shown in FIG. 18.
Figure 22:
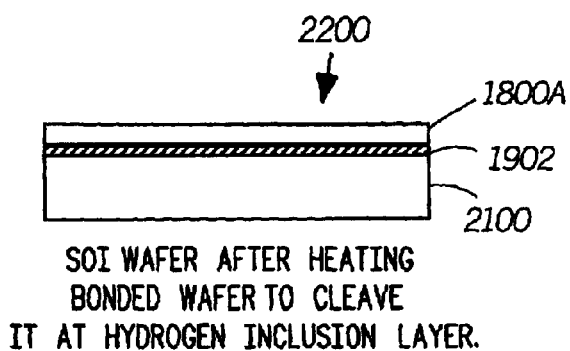
FIG. 22 is a SOI wafer obtained by cleaving the wafer shown in FIG. 21.

FIG. 17 is a flow chart of a process of making the SOI wafer 200 (FIG. 2) obtained in step 102 (FIG. 1). In step 1702 a first silicon wafer is obtained. FIG. 18 is a depiction of a silicon wafer 1800 used in making a SOI wafer. The wafer includes a disk of silicon 1802. In step 1704 an oxide layer 1902 (FIG. 19) is formed on the silicon disk 1802. The oxide layer 1902 (FIG. 19) is preferably thermally grown. FIG. 19 is a sectional elevation view of the oxidized wafer 1800. The wafer 1800 has a top layer of oxide 1902. The oxide layer 1902 may in fact cover the bottom of the wafer 1800 but a bottom layer of oxide is not critical. In step 1706 hydrogen is implanted into the oxidized wafer at a predetermined average penetration depth below the oxidized layer 1902. FIG. 20 is sectional elevation view of the wafer 1800 after the hydrogen implantation step. The wafer 1800 now comprises the top oxide layer 1902, and upper 1800A, and lower 1800B silicon layers, separated by a hydrogen implanted silicon layer 2002. In step 1708 the implanted, and oxidized side of the wafer 1800 is placed in contact with a second wafer 2102 of the kind depicted in FIG. 18, and the two wafers adhere by Van Der Waals forces to form a bonded wafer 2100. FIG. 21 is a sectional elevation of the wafer depicted in FIG. 20 contacting a second wafer. In step 1710 the bonded wafer is heated to about 500 C. The heating causes the defects caused by the hydrogen implantation and/or included hydrogen to coalesce thereby cleaving the wafer at about the predetermined average depth of the hydrogen implant. FIG. 22 is a SOI wafer 2200 obtained by cleaving the wafer shown in FIG. 21. The SOI wafer comprises the upper silicon layer 1800A, as an upper device layer, and the second wafer 2102 as abase, and the oxide layer 1902 interposed between the upper silicon layer 1800A and the second wafer 2102. In step 1712 the SOI wafer is given a high temperature anneal in an inert atmosphere at 1000 C. to 1300 C. for 30 minutes to 2 hours to improve bonding among the oxide layer and the second wafer 2102.

Figure 23:
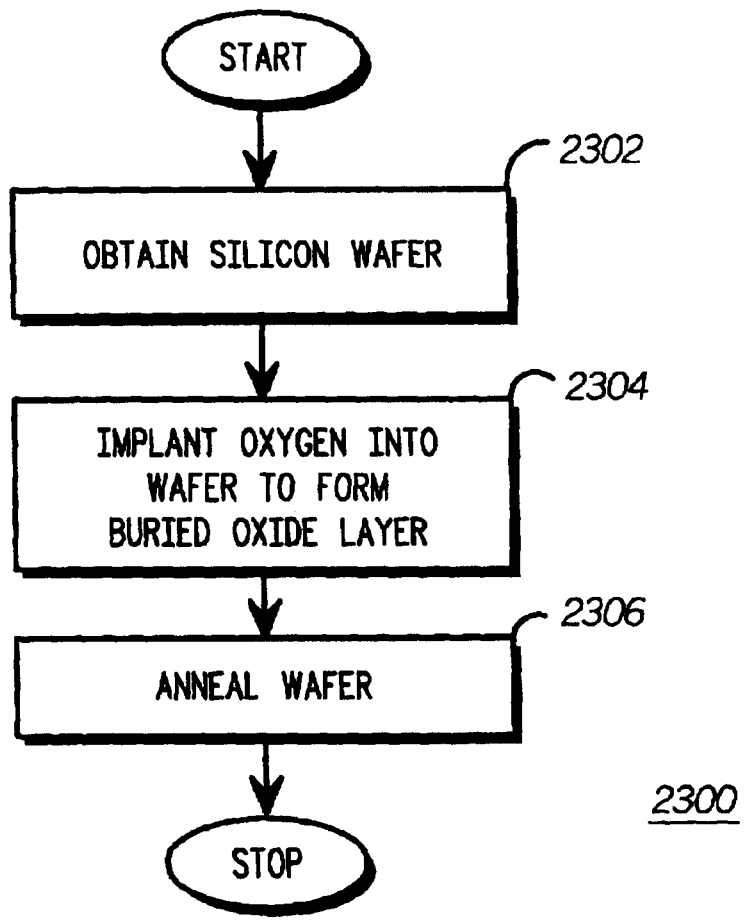
FIG. 23 is a flow chart of a second process of making a SOI wafer.

FIG. 23 is a flow chart of a second process 2300 of making a SOI wafer. In step 2302 a silicon wafer is obtained. In step 2304 the wafer is implanted with oxygen to form a buried oxide layer. In step 2306 the wafer is annealed to repair damage to the crystal structure caused by the implanting step.

Figure 24:
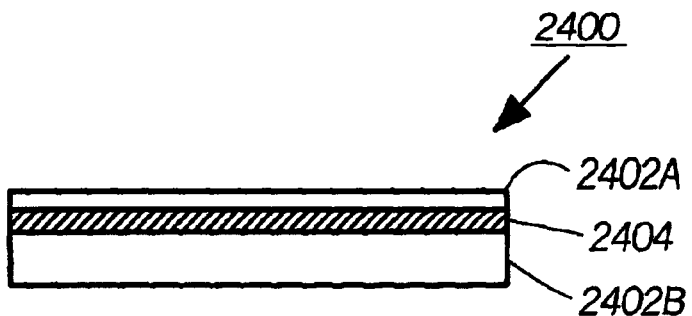
FIG. 24 is a sectional elevation view of the SOI wafer made by the process shown in FIG. 23.

FIG. 24 is a sectional elevation view of the SOI wafer 2400 made by the process shown in FIG. 23. The wafer 2400 comprises a silicon base 2402B, an oxide layer 2404 formed by oxygen implantation overlaying the silicon base 2402, and a top layer of silicon 2402A overlying the oxide layer 2404.

A third process 2500 for making a SOI wafer will presently be described with reference to FIGS. 25–27. The third process is a variant of the BESOI process mentioned above. Wafers manufactured by this process or similar processes are available from Canon U.S.A., Inc., of Lake Success, N.Y.

Figure 25:
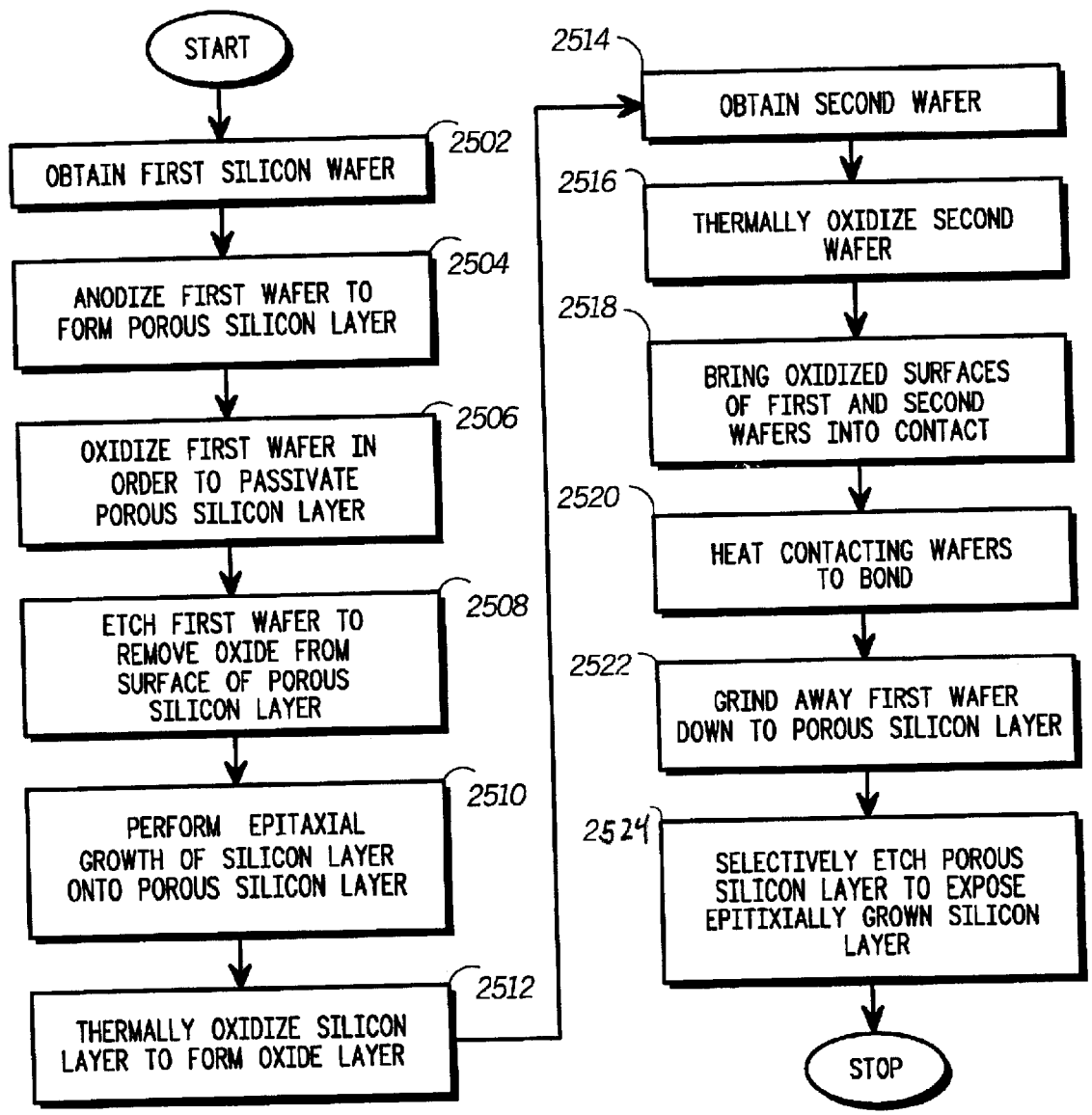
FIG. 25 is a flow chart of a third process of making a SOI wafer.
Figure 26:
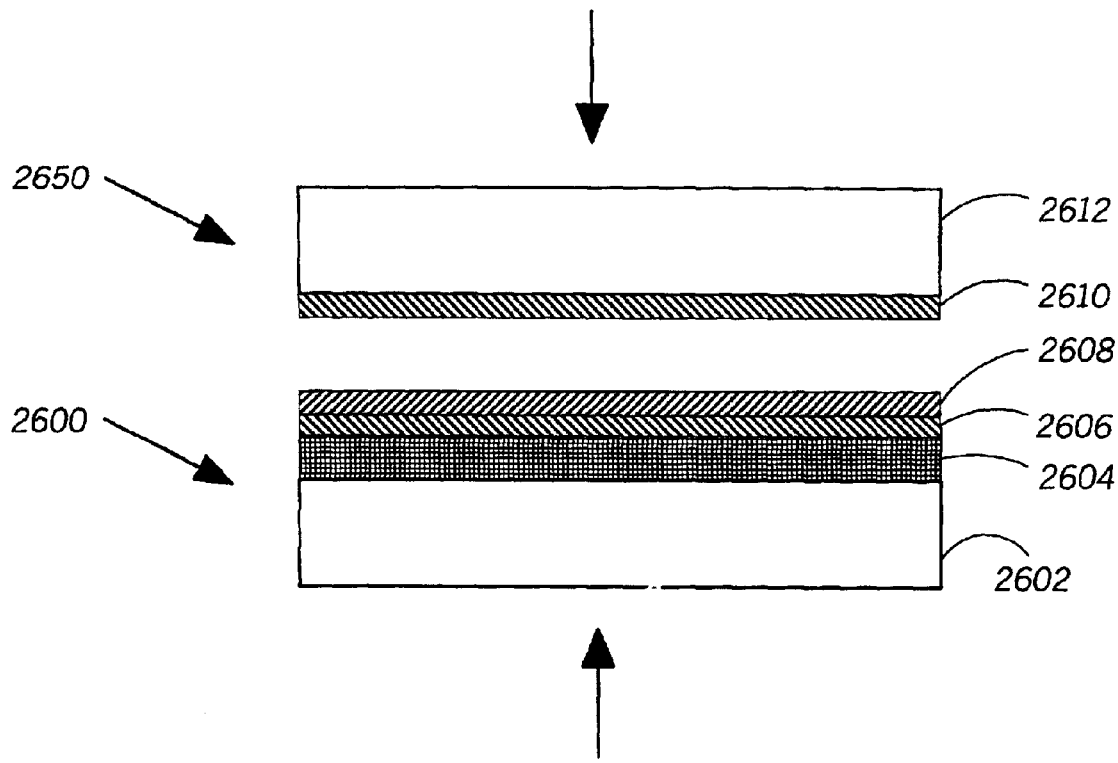
FIG. 26 depicts sectional elevation views of two wafers used to make the SOI wafer according to the process shown in FIG. 25.

FIG. 25 is a flow chart of the third process 2500 of making a SOI wafer. FIG. 26 depicts sectional elevation views of two wafers produced and used in the process of making the SOI wafer shown in FIG. 25.

In step 2502 a first silicon 2600 wafer is obtained. At the start of process 2500, the first silicon wafer includes a first doped single crystal silicon disk 2602. According to an exemplary embodiment of the invention, the disk 2602 is P doped and has a resistivity of from about 0.01 to about 0.02 ohm-cm. In step 2504 the disk 2602 is anodized to form a porous silicon layer 2604 having a thickness of from about one to about ten microns. According to an exemplary embodiment of the invention the wafer is anodized in a solution of a 49% Hydrofluoric acid solution and C2H5OH mixed in a two-to-one ratio using a current density of about 7 mA/cm$^2$. In step 2506 the first wafer 2600 is oxidized in order to passivate the porous silicon layer. According to an exemplary embodiment the wafer 2600 is oxidized in step 2508 by heating it to about 400 C. for about one hour in an oxygen atmosphere. In step 2508, the wafer is etched to remove the oxide from the surface of the porous silicon layer 2604. In step 2510 a nonporous silicon layer 2606 is epitaxially grown on the surface of the porous silicon layer 2604. According to an exemplary embodiment of the invention the nonporous silicon layer 2606 is grown using Chemical Vapor Deposition (CVD) in which the wafer 2600 with the passivated porous silicon layer 2604 is heated to 900 C. in an 80 Torr ambient of dichlorosilane and Hydrogen. In step 2512 a first oxide layer 2608 is thermally grown on the nonporous silicon layer 2606.

In step 2514 a second wafer 2650 is obtained. Initially, the second wafer includes a second doped silicon disk 2612. In step 2516 the second wafer 2650 is thermally oxidized to form a second oxide layer 2610 on the second doped silicon disk 2612. In step 2518 the oxide layer 2610 of the second wafer 2650 and the oxide layer 2608 of the first wafer 2600 are brought into contact. In step 2520 the two contacting wafers 2600, 2650 are heated in order to cause a bond to form between the two oxide layers 2608, 2610 and produce a bonded wafer. In step 2522 the first disk of silicon 2602 is ground away to expose the porous silicon layer 2604. In step 2524 the porous silicon layer 2604 is selectively etched, to expose the nonporous silicon layer 2606. According to an exemplary embodiment of the invention the porous silicon layer can be selectively etched using a mixture of 49% Hydrofluoric acid (HF) and 30% hydrogen peroxide ($H_2O_2$) in a 1:5 ratio.

Figure 27:
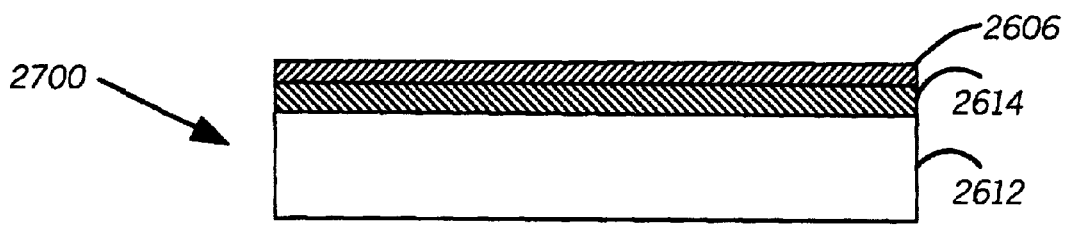
FIG. 27 is a sectional elevation view of a SOI wafer produced by the process shown in FIG. 25.

FIG. 27 is a sectional elevation view of a SOI wafer 2700 produced by the process shown in FIG. 25. The SOI wafer 2700 includes the second doped silicon disk 2612 as a bulk layer. An oxide layer 2614 formed by bonding the oxide layer 2608 of the first wafer 2600 and the oxide layer 2610 of the second wafer 2650, is born on the second doped silicon disk 2612, and the nonporous silicon layer 2606 is born on the oxide layer 2614.

Although three different methods for manufacturing SOI wafers have been described above, the present invention is not limited to using SOI wafers made by any particular process.

Processes that are suitable for producing MEMS resonators in bulk silicon wafers will presently be described. These processes employ deep trench etching techniques to form resonant structures that are aligned perpendicular to the surface of the wafer in which they are made. By achieving a MEMS resonator with perpendicular orientation, it is possible to greatly reduce the area of wafer required to accommodate a MEMS resonator. The latter economy in wafer area utilization reduces overall manufacturing costs for a device that employs a MEMS resonator.

FIGS. 28 through 34 are a sequence of depictions of a section of a wafer at which a MEMS device is being fabricated at various stages in the fabrication. These views will be referred to in the following description of the fabrication process. Due to the great differences in size between a semiconductor wafer and the devices fabricated thereon, these views are not drawn to scale.

Figure 28:
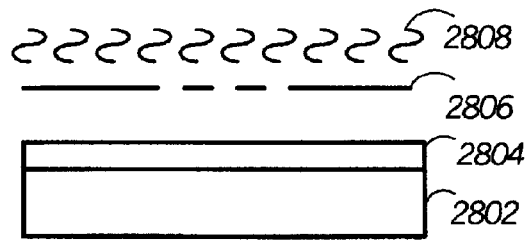
FIG. 28 is a sectional elevation view of a wafer bearing a first resist that is being exposed to patterning radiation in a process for making a MEMS resonator.

FIG. 28 is a sectional elevation view of a wafer 2806 bearing a first resist 2804 that is being exposed to patterning radiation 2808 using a first mask 2806 in a process for making a MEMS resonator.

Figure 35:
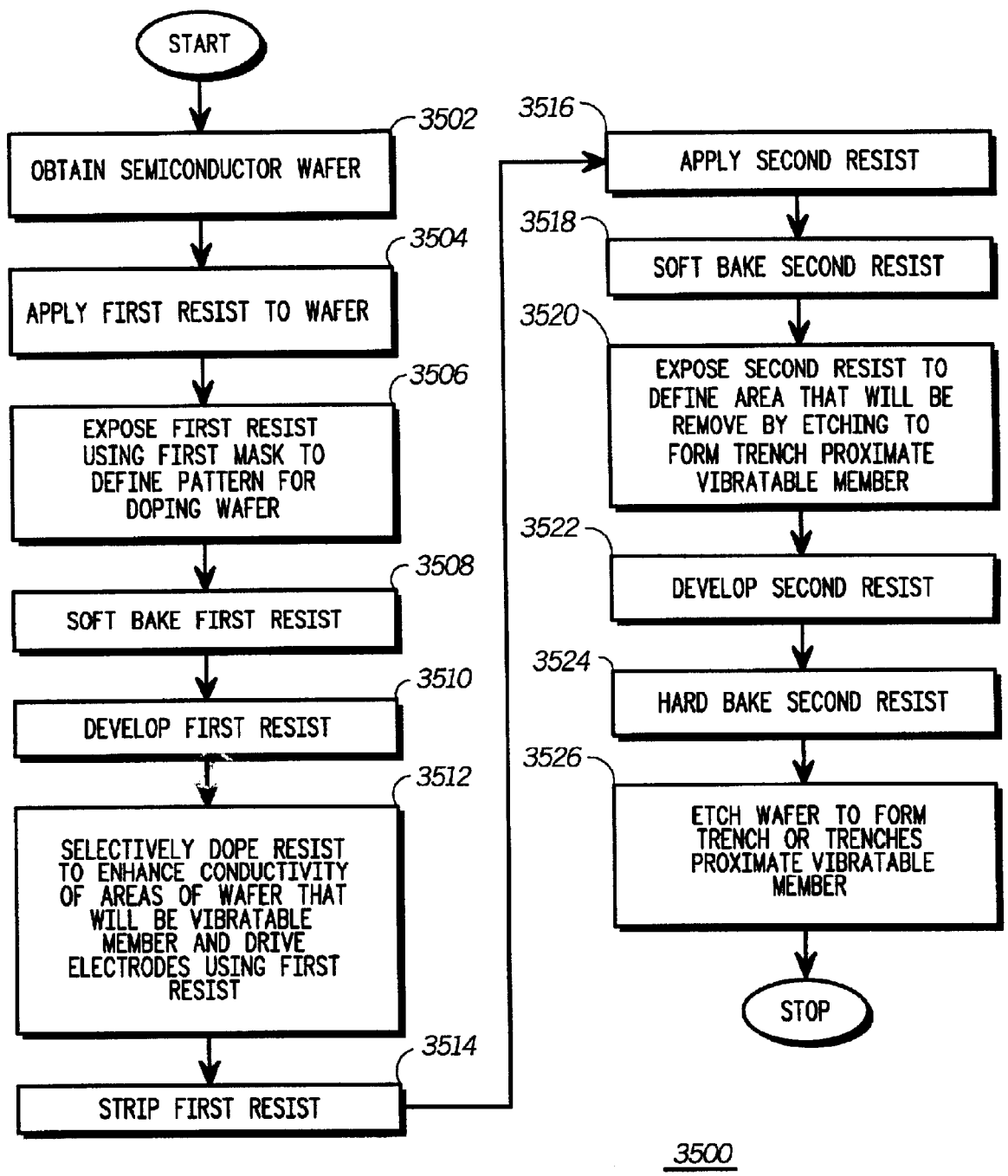
FIG. 35 is a flow chart of a process of making a MEMS resonator according to an embodiment of the invention.

FIG. 35 is a flow chart of a process 3500 of making a MEMS resonator according to an embodiment of the invention. In step 3502 the semiconductor wafer 2802 is obtained. In step 3504 the first resist 2804 is applied to the semiconductor wafer 2802. In step 3506 the first resist 2804 is imagewise exposed to radiant or corpuscular radiation 2808 using the first mask 2806. In step 3506 the first resist 2804 bearing wafer 2802 is soft baked to evaporate volatile solvents from the resist 2804. In step 3510 the first resist is developed. The resist 2804 can optionally be hard baked after the development step 3510.

Figure 29:
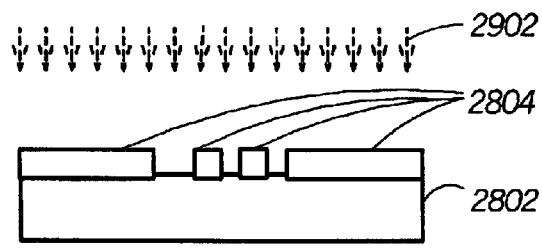
FIG. 29 is a sectional elevation view of the wafer shown in FIG. 28 during a doping operation.

FIG. 29 is a sectional elevation view of the wafer shown in FIG. 28 during a doping operation. The first resist 2804 is shown in a patterned condition in FIG. 29 after the development step 3510. Dopant atoms or ions 2902 are represented as vectors directed at the wafer 2802.

Figure 30:
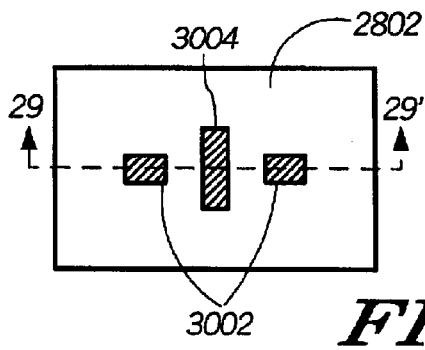
FIG. 30 is a plan view of the wafer shown in FIG. 29 showing doped areas.

FIG. 30 is a plan view of the wafer shown in FIG. 29 showing doped areas. The section plane corresponding to FIG. 29 is indicated on FIG. 30.

Figure 33:
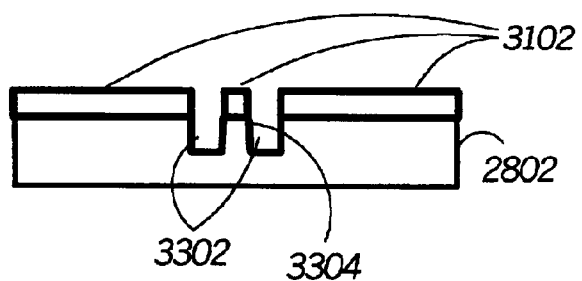
FIG. 33 is a sectional elevation view of the wafer shown in FIG. 32 after etching using the second resist.
Figure 34:
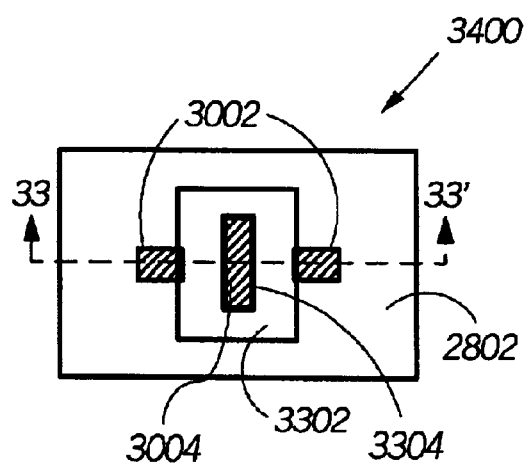
FIG. 34 is a plan view of a first vertically oriented resonant member MEMS resonator device.

In step 3512 the wafer 2802 is selectively doped to enhance the conductivity of selected areas. A first area 3004 that is doped will be located at the top of a vibrating member 3304 (FIGS. 33, 34). Two additional areas 3002 that are doped will be used as electrodes to exert electric forces on the vibrating member 3304 and capacitively couple signals to and from the vibrating member 3304 (FIGS. 33, 34).

Figure 31:
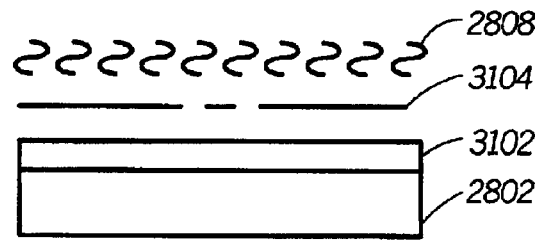
FIG. 31 is a sectional elevation view of the wafer shown in FIG. 29 bearing a second resist that is being exposed to patterning radiation.

FIG. 31 is a sectional elevation view of the wafer 2802 shown in FIG. 29 bearing a second resist 3102 that is being exposed to patterning radiation 2808.

In step 3514 the first resist 2804 is stripped from the wafer, and in step 3514 the second resist 3102 is applied to the wafer 2802. In step 3520 the second resist is soft baked. In step 3520 the second resist is imagewise exposed to radiant or corpuscular energy 2808 using a second mask 3104 in order to define areas for etching the wafer 2802.

Figure 32:
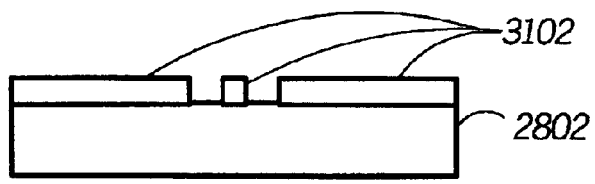
FIG. 32 is a sectional elevation view of the wafer shown in FIG. 31 after development of the second resist.

In step 3522 the resist is developed. FIG. 32 is a sectional elevation view of the wafer shown in FIG. 31 after development of the second resist. In FIG. 32 the second resist 3102 is seen in a patterned condition.

In step 3524 the second resist 3102 is hard baked. The step of hard baking makes the second resist 3102 more etch resistant so that over etching is reduced. In step 3526 the wafer 2802 is etched to form a trench 3302 (FIGS. 33, 34) proximate to a vibrating member 3304 (FIGS. 33, 34). To fabricate resonators according to other embodiments of the invention two or more trenches are etched rather than a single trench.

FIG. 33 is a sectional elevation view of the wafer shown in FIG. 32 after etching using the second resist, and FIG. 34 is a plan view of a MEMS resonator device 3400 showing doped areas 3002, 3004 and an etched rectangular trench 3302 surrounding a vibrating member 3304. The section plane used in FIG. 33 is indicated in FIG. 34. As seen in FIG. 34 a single closed curve, rectangular plan trench 3302 surrounds the vibrating member 3004.

The length of the vibrating member 3004 is the vertical dimension of the vibrating member 3304 in the plan view shown in FIG. 34. The width of the vibrating member 3304 is the horizontal dimension of the vibrating member 3304 in the plan view shown in FIG. 34. The height of the vibrating member 3304 is the vertical dimension of the vibrating member 3304 in the sectional elevation view of shown in FIG. 33. The depth of the trench 3302 is equal to the height of the vibrating member 3304. The ratio of the height of the vibrating member 3304 to the width of the vibrating member is preferably at least about five more preferably at least about ten. In order to achieve high ratios between the depth of the trench 3304 and its width, a reactive ion etcher (RIE) tool is preferably used to form the trench 3304. Reactive ion etchers are capable of etching trenches having aspect ratios of at least about fifty to one. Using deep trench etching allows long beam to be fabricated oriented perpendicularly to the wafer 2802 surface and occupy a small area of the wafer 2802. Additionally, by fabricating a vibrating member that is only attached to the wafer 2802 at its bottom, and making the vibration member long by using deep trench etching, a vibrating member with good Q can be obtained.

In operation the doped electrode areas 3002 can be used to connect the MEMS resonator 3400 to an external circuit such as an oscillator circuit in which the MEMS resonator serves as a frequency selective positive feedback element. In an oscillator circuit, one of the electrodes 3002 can be connected to the oscillators amplifier output, and the other could be connected to the oscillators amplifier input to provide a feedback pathway. The resonance mode of the vibrating member 3304 is the mode of a plate that is clamped at one end. The top of the vibrating member 3304 (visible in FIG. 34) will oscillate back and forth along an axis connecting the two doped electrode regions 3002. The vibrating member 3304 exhibits resonances at one or more selected frequencies that depend on its dimensions, and the material properties of the silicon wafer from which it is made. The dimensions of the vibrating members in this and other embodiments can be chosen to obtain a selected frequency of vibration using principles of solid mechanics analysis. A Finite Element Method (FEM) model based on solids mechanics principles can be used in selecting the dimensions of the vibrating member to obtain a selected frequency of vibration.

Figure 36:
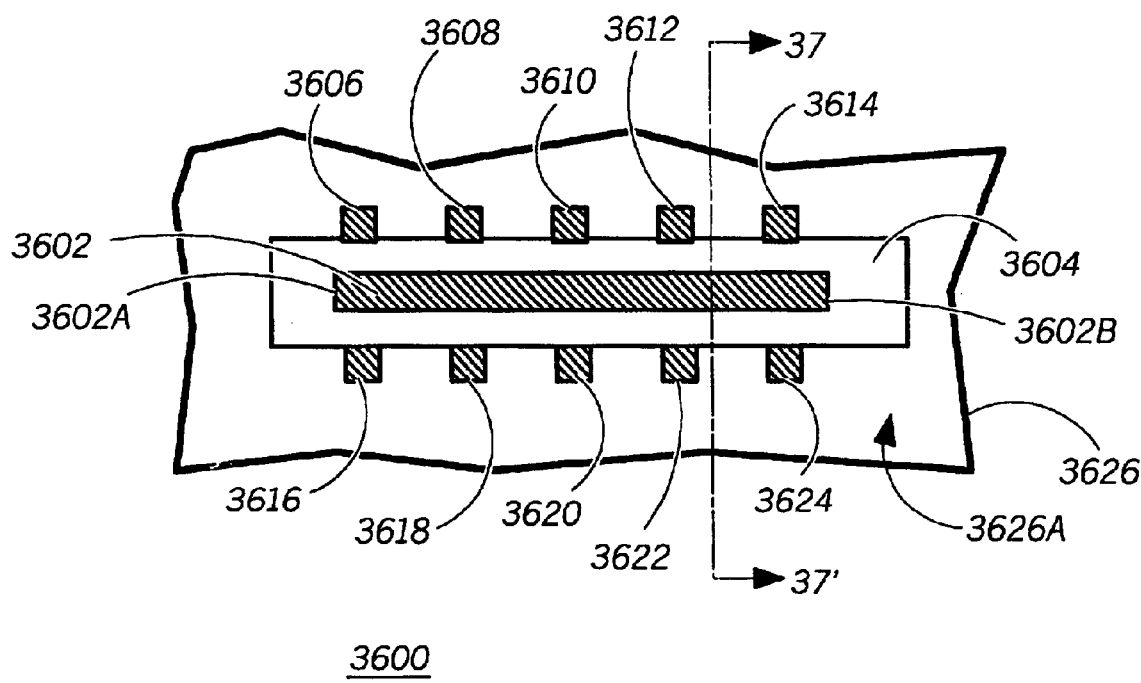
FIG. 36 is a fragmentary plan view of a MEMS resonator that has vibrating plate oriented perpendicular to a semiconductor chip surface.
Figure 37:
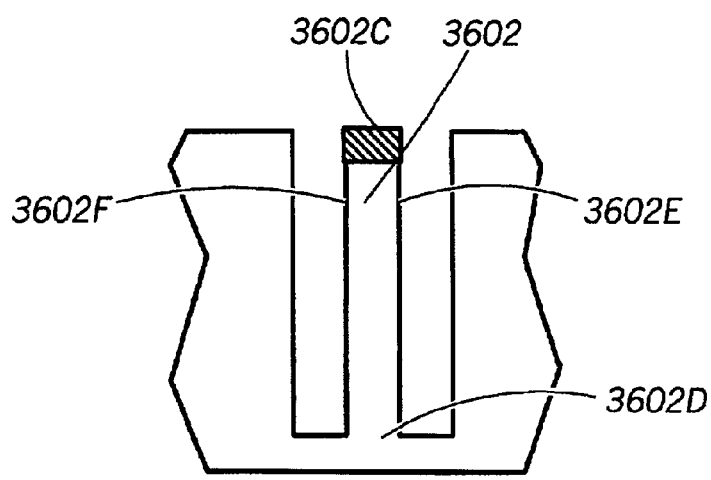
FIG. 37 is a sectional elevation view of the MEMS resonator shown in FIG. 36.

FIG. 36 is a fragmentary plan view of a MEMS 3600 resonator that has vibratable plate 3602 oriented perpendicular to a semiconductor chip surface 3626A. FIG. 37 is a sectional elevation view of the MEMS resonator 3600 shown in FIG. 36. The section plane of FIG. 37 is indicated in FIG. 36.

The MEMS resonator 3600 includes a vibrating plate 3602 that is dimensioned to support a vibration mode that includes five anti-nodes, and driven by five pairs of drive electrodes (including electrodes 3606–3624) to vibrate in the vibration mode. The resonator 3600 comprise deep trench 3604 etched in the surface 3626A of a semiconductor chip 3626. The plan of the deep trench 3604 follows a closed curve path, specifically a rectangular path. The closed curve deep trench bounds the vibrating plate 3602. The vibrating plate 3602 includes a first free side edge 3602A, a second free side edge 3602B, a free top edge 3602C (FIG. 37), and a bottom edge 3602D (FIG. 37) that is connected to the semiconductor chip 3626. The vibrating plate 3602 further comprises a first face 3602E and a second face 3602F. The vibrating plate 3602 is perpendicular to the surface 3626A of the semiconductor chip 3626. In other words a vector normal to the first face 3602E is perpendicular to a vector normal to the surface 3626A of the semiconductor chip 3626. The top edge 3626C of vibrating plate 3602 is preferably selectively doped to increase its conductivity and thereby enhance its electric force interaction with the drive electrodes 3606–3624. According to an alternative embodiment of the invention the top edge 3626C is not selectively doped. In the latter case it is conductive due to the dopant present in the whole semiconductor chip 3626.

Five drive electrodes 3606–3614 are arranged from left to right in a row on one side of the trench 3604 (top side in FIG. 36) opposite the vibrating plate 3602. Five more drive electrodes 3616–3624 are arranged from left to right on an opposite side of the trench 3604 (bottom side in FIG. 37) opposite the vibrating member 3602. The drive electrodes 3606–3624 are preferably formed by selectively doping the semiconductor chip 3626. Pairs of electrodes that are directly across the vibrating plate 3602 from each other have opposite electrical phases. For example the first electrode 3606 in the top row 3606, and the first electrode 3616 in the bottom row 3616 would differ in phase by Σ radians. Also each electrode has an opposite electrical phase compared to electrodes that are directly adjacent to it on the same side of the vibrating plate 3602. Thus the electrical phase of the first electrode 3606 on the top row 3606 would differ by Pi radians from the second electrode 3608 on the top row 3608. In operation as the vibrating plate 3602 vibrates in a mode with anti-nodes corresponding to the positions of the electrodes 3606–3624, it will induce electrical signals in the electrodes 3606–3624 with the relative phasing just mentioned. On the other hand if electrical signals with the relative phasing mentioned are applied to the electrodes 3606–3624 the signals will induce the vibrating plate 3602 to vibrate in the mode with anti-nodes corresponding the positions of the electrodes. The doping of the top edge 3602C of the vibrating plate 3602C aids in the interaction with the electrodes 3606–3614. As discussed above with reference to the resonators shown in FIGS. 13–16, the resonator shown in FIGS. 36–37 and other resonators discussed below can be coupled to external circuits in more than one alternative ways. With reference to the resonator 3600 shown in FIG. 36 one connection topology is to connect all the electrodes having one phase to one side of an external circuit, and to connect all the other electrodes that are at opposite phase to the other side of the electrical circuit.

Figure 38:
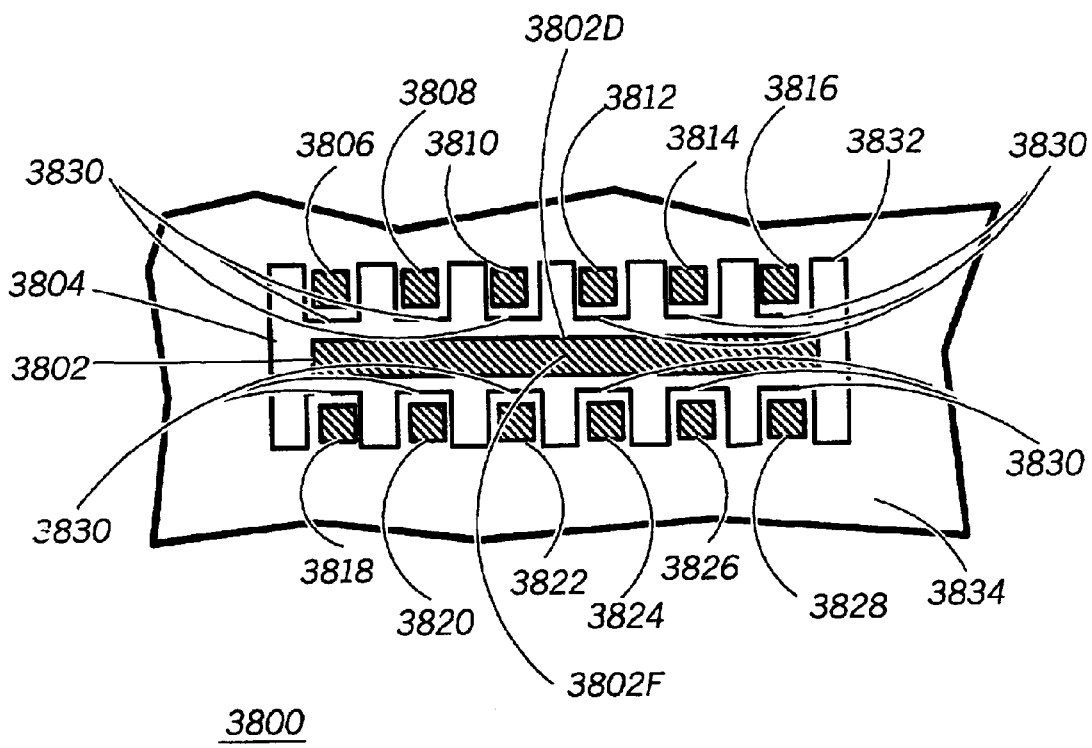
FIG. 38 is a fragmentary plan view of a MEMS resonator that has a corrugated trench wall.

FIG. 38 is a fragmentary plan view of a third MEMS resonator 3800 which has a corrugated trench wall 3832. The resonator 3800 is fabricated in the surface of a semiconductor chip 3834. The resonator 3800 includes a vibrating plate 3802 that has a bottom edge 3802D connected to the semiconductor chip 3834. The vibrating plate 3802 is rectangular in shape, and its three edges other than from the bottom edge are free. The top edge 3802 of the vibrating plate 3802 is doped to enhance its electric field interaction with the electrodes 3806–3828. The corrugated wall 3832 that is etched in the semiconductor chip 3834 surrounding the vibrating plate 3802, includes a number of inwardly projecting corrugations 3830. A plurality of electrodes 3806–3828 that are made by selectively doping regions of the semiconductor chip 3834 are located on the inwardly projected corrugations 3830 of the corrugated wall 3832. The inwardly projecting corrugations 3830 aid in electrically isolating the electrodes 3806–3828 from each other. The electrodes 3806–3828 are arranged in two rows of six. A first row includes six electrodes 3806–3816 spaced along one side (top side in FIG. 38) of the resonator 3800, facing the vibrating plate 3802. A second row includes six more electrodes 3818–3828 spaced along a second side (bottom side in FIG. 38) of the resonator 3800, facing the vibrating plate 3802. The electrical phase of every other electrode in each row is the same. Adjacent electrodes within a row have phases that are Σ radians apart (i.e., opposite phases). Electrodes that are across the vibrating plate 3802 from each other also have opposite phases. The vibrating plate 3820 vibrates in a mode that has six anti-nodes and five nodes. One node is located at the longitudinal center 3802F of the vibrating plate 3820.

By virtue of the facts that the vibrating plate 3802 is symmetric as judged from its longitudinal center 3802F, vibrates in a mode that has a node at its center, and vibrates in a mode that is anti-symmetric as judged from its center, the effects of external jarring can be minimized by connecting a first set of electrodes that has a first electrical phase to one input of a differential circuit (e.g. input of a differential amplifier) and connecting a second set of electrodes that has a phase opposite to that of the first set of electrodes to a second input of the differential circuit. When the resonator is jarred, the vibrating plate 3802 will tend to pick up a motion that is symmetric in contrast to its anti-symmetric vibration mode. The motion caused by jarring will cause common mode signals to be induced in the electrodes that will be rejected by the differential circuit.

Figure 39:
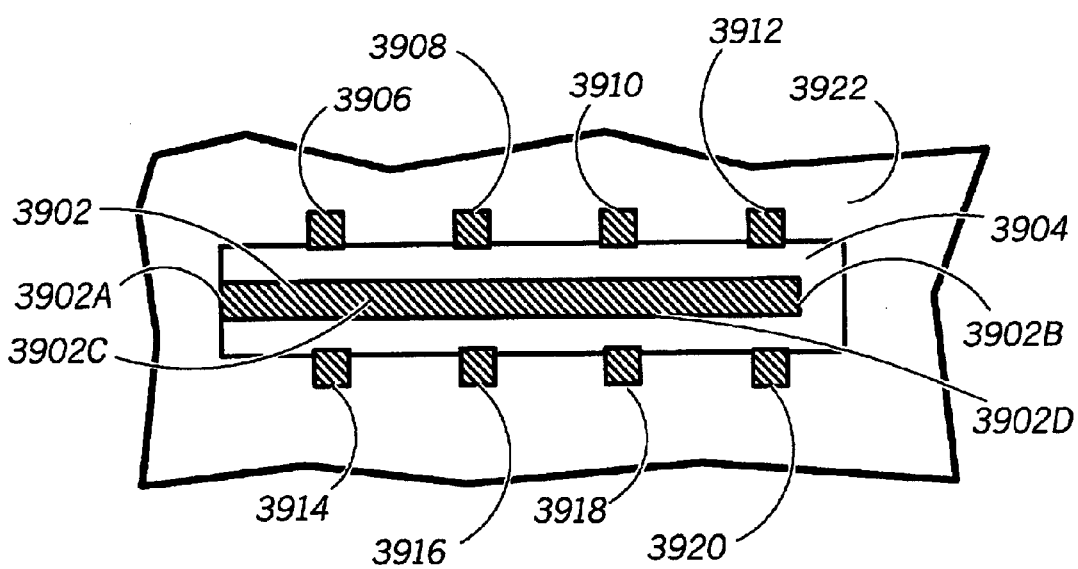
FIG. 39 is a fragmentary plan view of a MEMS resonator that includes a vibrating plate with two clamped edges.

FIG. 39 is a fragmentary plan view of a MEMS resonator 3900 that includes a vibrating plate with two clamped edges. This MEMS resonator 3900 has a open curve, specifically a U-shaped deep trench 3904 in a semiconductor chip 3926, partially (on three side) surrounding a vibrating member 3902. The vibrating plate 3902 has two edges clamped, i.e., connected to the semiconductor chip 3922. A first side edge 3902A, and a bottom edge 3902D are connected to the semiconductor chip. A top edge 3902C and a second side edge 3902B are free. The vibrating plate 3902 is dimensioned to vibrate in a mode that includes four anti-nodes. Four electrodes 3906–3912 are arranged in a first row along one side (top side in FIG. 39) of the trench 3904. Four more electrodes 3914–3920 are arranged in a second row along a second side (Cower side in FIG. 39) of the trench 3904. One electrode from each of the rows is located adjacent to each of the four anti-nodes. The electrodes adjacent to each anti-node, (one from each row) have opposite electrical phases. Within a row the electrical phase of the electrodes changes by half a cycle from one electrode to the next. The top edge 3902C of the vibrating plate 3902 is preferably doped so that the vibrating plate 3902 interacts with the electrodes 3906–3920 via electric force interaction.

Figure 40:
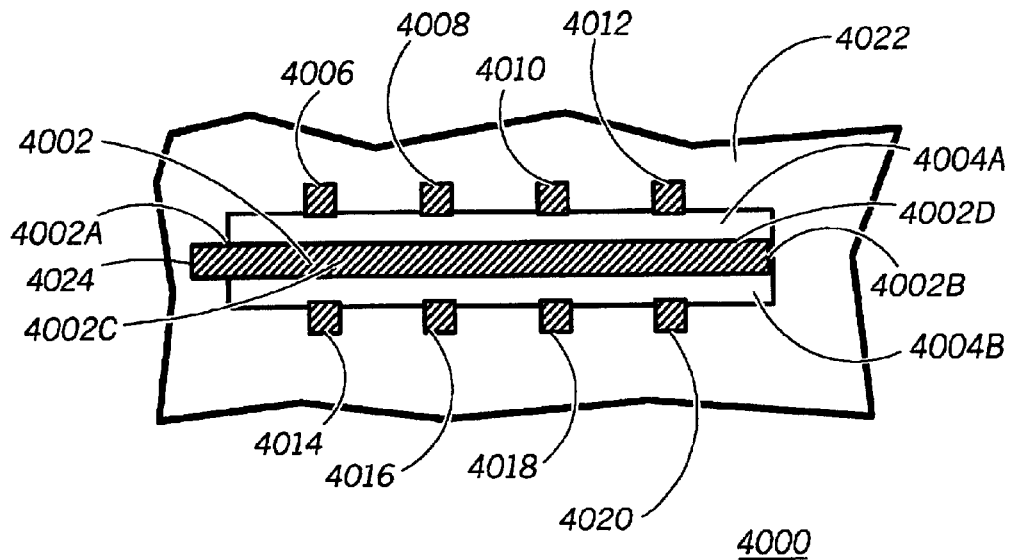
FIG. 40 is a fragmentary plan view of a MEMS resonator that includes a vibrating plate with three clamped edges.

FIG. 40 is a fragmentary plan view of a MEMS resonator 4000 that includes a vibrating plate 4002 with three clamped edges. The resonator 4000 is fabricated in a semiconductor chip 4022 and includes a vibrating plate 4002 bounded by a first deep trench 4004A on one side (top side in FIG. 40) and a second deep trench 4004B on a another side (bottom side in FIG. 40). The vibrating plate 4002 is clamped (i.e., connected to the silicon chip 4022) at a first side edge 4002A, a second side edge 4002B, and a bottom edge 4002D. The top edge 4002C is free. Four electrodes 4006–4012 are arranged in a row on the semiconductor chip 4022 along the side of the first deep trench 4004A opposite the vibrating plate 4002. Four more electrodes 4014–4020 are arranged in a row on the semiconductor chip 4022 along the side of the second deep trench 4004B opposite the vibrating plate 4002. The eight electrodes 4006–4020 are preferably formed by selectively doping the semiconductor chip 4022. The top edge 4002C of the plate 4002 is preferably also doped to enhance its electric field interaction with the electrodes 4006–4020. The doped region of the top plate extends to a contact area 4024 beyond the side edge 4002A of the plate 4002. The vibrating plate 4002 is dimensioned to vibrate in a mode that has four anti-nodes. One electrode from each row is positioned at the longitudinal position of one of the anti-nodes. The two electrodes positioned at each anti-node have opposite electrical phases. Within each row the electrical phase increases by half a cycle from one electrode in the row to the next.

Figure 41:
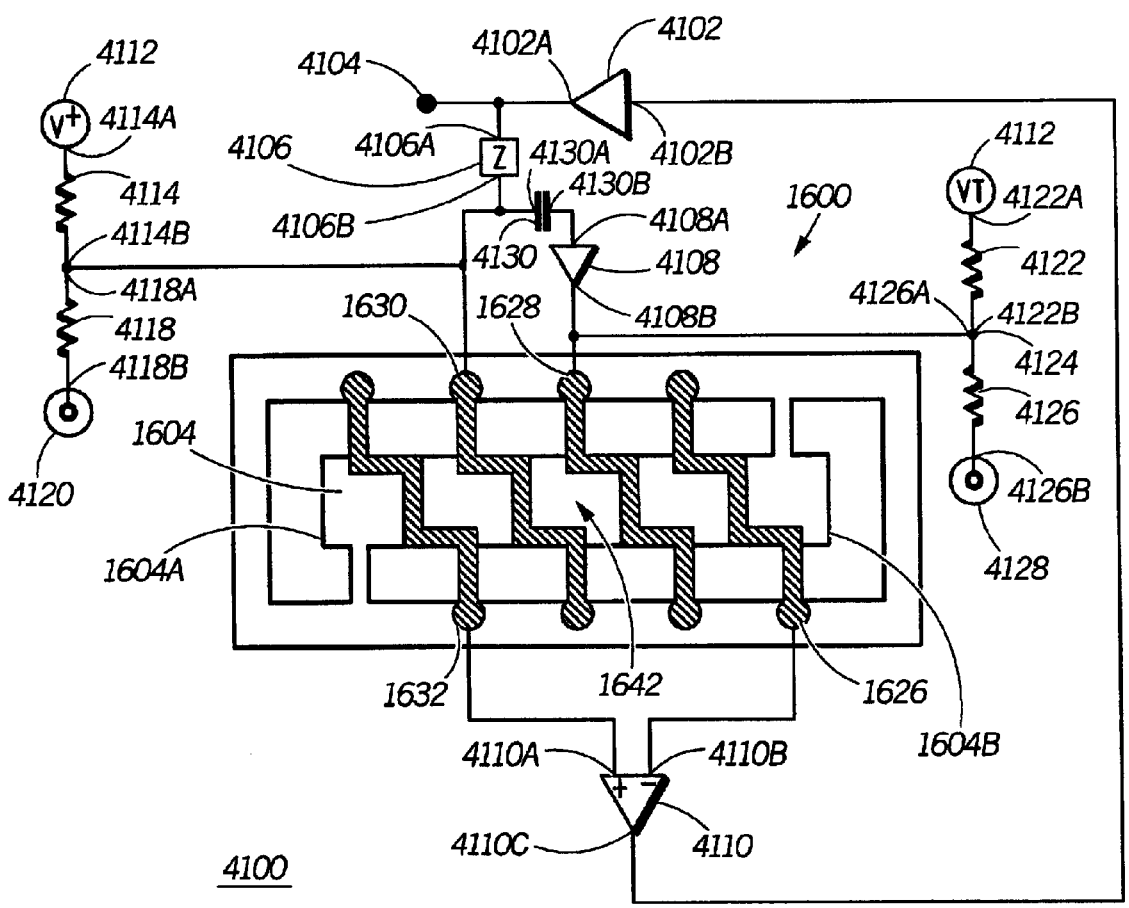
FIG. 41 is a schematic of an oscillator using the MEMS resonator shown in FIG. 16.

FIG. 41 is a schematic of an oscillator 4100 using the MEMS resonator 1600 shown in FIG. 16. An oscillator amplifier 4102 has an output 4102A coupled to an output terminal 4104 and to an input 4106A of an impedance network 4106. The impedance network 4106 can consist of a resistor. The impedance network serves to adjust the amplitude and optionally the phase of a fed back portion of the output of the oscillator amplifier 4102. The impedance network has an output 4106B coupled to a first doped conductive region 1630 of the resonator 1600, and to a first terminal 4130A of a DC blocking capacitor 4130. A second terminal 4130B of the DC blocking capacitor 4130 is coupled to an input 4108A of a unity gain inverting amplifier 4108. An output 4108B of the unity gain inverting amplifier 4108 is coupled to a second doped conductive region 1628 of the resonator 1600.

Voltage dividers are used to bias the output of the signals output by the impedance network 4106, and the unity gain inverting amplifier 4108. A first voltage divider that is used to bias the output of the impedance network 4106 comprises a top resistor 4114 including a top terminal 4114A coupled to a voltage source 4112, and a bottom terminal 4114B coupled to a first voltage divider midpoint 4116. A bottom resistor 4118 includes a top terminal coupled to the first voltage divider midpoint 4116, and a bottom terminal 4118B coupled through a first via 4120 to the silicon base layer 202 (FIG. 16). The midpoint 4116 of the first voltage divider is coupled to the output 4106B of the impedance network 4106.

A second voltage divider that is used to bias the output 4108B of the unity gain inverting amplifier 4108 comprises a top resistor 4122 that includes a top terminal 4122A coupled to the voltage source 4112, and a second terminal 4122B coupled to a second voltage divider midpoint 4124. The second voltage divider further comprises a bottom resistor 4126 that includes a top terminal 4126A coupled to the second voltage divider midpoint 4124, and a bottom terminal coupled through a second via 4128 to silicon base layer 202 (FIG. 16). The second voltage divider midpoint is coupled to the output 4108B of the inverting unity gain amplifier 4108.

Biasing the first conductive region 1630, and the second conductive region 1628 using the first and second voltage dividers establishes an attractive force between the resonant member 1604, and the silicon base layer 202 (FIG. 16). In operation of the oscillator, the attractive force will be modulated by periodic signals applied to the first and second conductive region 1630, 1628. The modulation of the attractive force, drives the flexural beam mode of the resonant member 1604.

The beam 1604 supports a transverse flexural vibration mode that has a first anti-node over which the first doped region crosses and a second anti-node over which the second doped region crosses. The first and second anti-nodes are located immediately adjacent (with no other intervening anti-nodes) and on opposite sides of the center 1642 of the beam 1604. The first and second anti-nodes have opposite phase, that is, they move in opposite directions (when one is deflected up the other is deflected down). Connecting the first doped region 1630 with the output of the impedance network 4106 directly, while driving the second doped region 1628 with the output Of the unity gain inverting amplifier 4106 will drive the above mentioned flexural vibration mode.

A non-inverting input 4110A of a differential amplifier 4110 is coupled to a third doped region 1632 of the resonator 1600. An inverting input 4110B of the differential amplifier 4110 is coupled to a fourth doped region 1626 of the resonator 1600. The third doped conductive 1632 region crosses an anti-node located adjacent the first end 1604A of the beam 1604. The fourth doped region 1626 crosses an anti-node adjacent to the second end 1604B of the beam 1604. An output 4110C of the differential amplifier 4110 is coupled to an input 4102B of the oscillator amplifier 4102.

The impedance network 4106, unity gain inverting amplifier 4108, resonator 1600, and differential amplifier 4110 form a regenerative feedback path for the oscillator amplifier 4102. A portion of an output signal of the amplifier oscillator 4102 is fed back through the regenerative feedback path to the input 4102B of the oscillator amplifier 4102 causing it to output a periodic signal. In operation a periodic signal i.e., the fed back signal, will pass through the resonator.

As discussed above differential signal connections to the resonator, such as shown in FIG. 41, are useful in lessening the effects of jarring motion on the output of the oscillator 4100.

Figure 42:
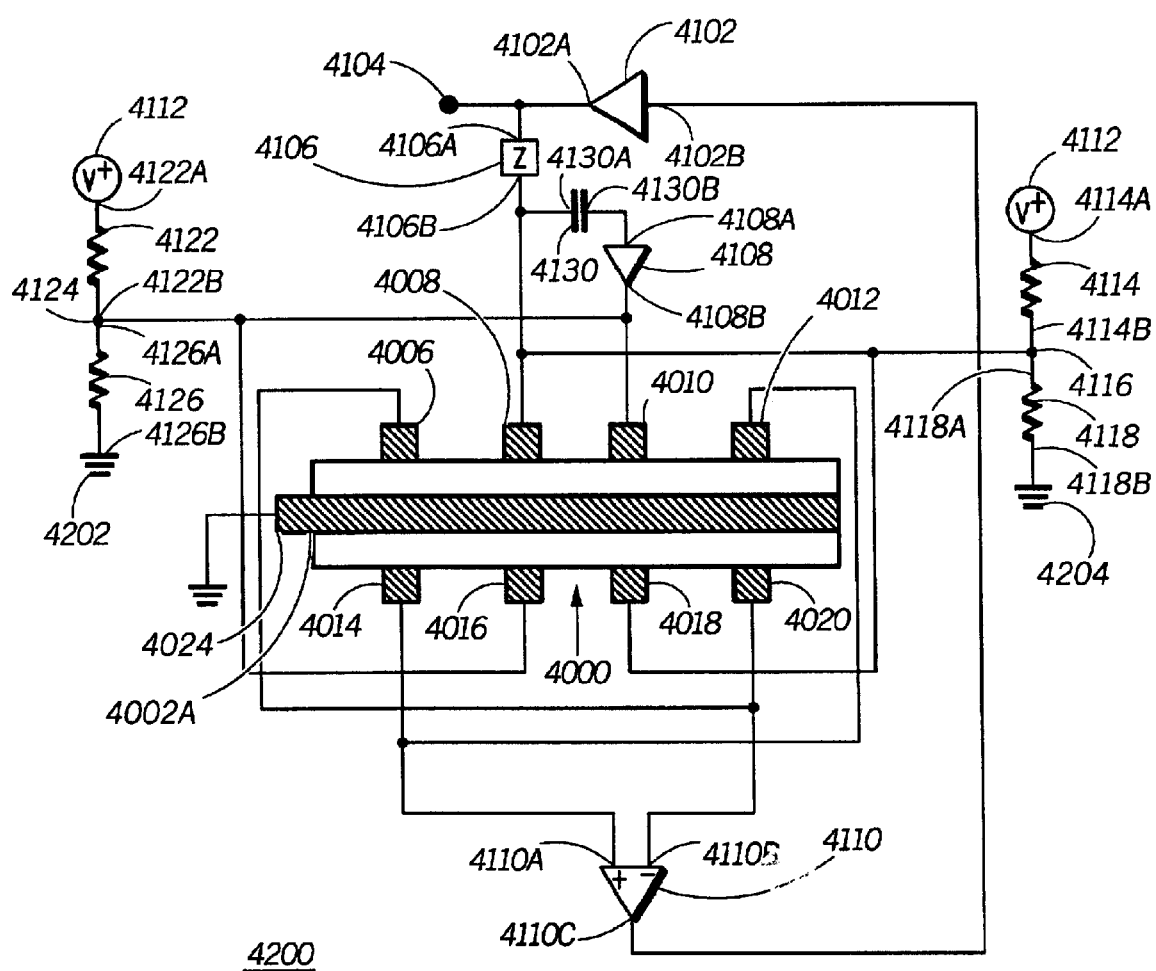
FIG. 42 is a schematic of an oscillator using the MEMS resonator shown in FIG. 40.

FIG. 42 is a schematic of an oscillator 4200 using the MEMS resonator 4000 shown in FIG. 40. The circuit elements other than the resonator 4000 are the same as shown in FIG. 41. Reference is made to the preceding description of FIG. 41 for a description of those circuit elements. The coupling of the resonator 4000 of FIG. 40 to the oscillator circuit is as follows. The output 4106B of the impedance network is coupled to a first electrode 4008, and a second electrode 4018. The first electrode 4008 is located on the first side (top side in FIG. 42) of the resonator 4000 at the longitudinal position of a first anti-node of the vibration mode of the vibrating plate 4002. The second electrode 4018 is located on the second side (bottom side in FIG. 42) of the resonator 4000 at the longitudinal position of a second anti-node. The first and second anti-nodes have opposite phase which is to say when one is deflects up (from the perspective shown in FIG. 42) the other deflects down. The output 4108B of the unity gain inverting amplifier 4108B is coupled to a third electrode 4010, and a fourth electrode 4016. The third electrode is located on the first side of the resonator 4000 adjacent to the first electrode 4008, and across from the second electrode 4018, i.e., at the longitudinal position of the second anti-node. The fourth electrode 4016 is located on the second side of the resonator 4000 adjacent to the second electrode 4018, and across from the first electrode 4008, i.e., at the longitudinal position of the first anti-node.

In the oscillator 4200, the bottom terminal 4118B of the bottom resistor 4118 of the first voltage divider, the bottom terminal 4126B of the bottom resistor of the second voltage divider, and the extension of the doped region 4024 are grounded to the semiconductor chip 4022.

In operation the first 4008 and second 4018 electrodes will receive the fed back signal at a first phase, and the third 4010, and fourth 4016 electrodes will receive the fed back signal at a second phase that differs from the first phase by one-hundred and eighty degrees.

The non-inverting input 4110A of the differential amplifier 4110 is coupled to a fifth electrode 4014 and a sixth electrode 4012. The fifth electrode 4014 is located on the second side of the resonator 4000 adjacent to the fourth electrode 4016, on the side of the first side edge 4002A of the vibrating plate 4002. The sixth electrode 4012 is located on the first side of the resonator 4000 adjacent to the third electrode 4010, on the side of the second side edge 4002B of the vibrating plate 4002. The inverting input 4110B of the differential amplifier 4110 is coupled to a seventh electrode 4020, and an eighth electrode 4006. The seventh electrode 4020 is located on the second side of the resonator 4002 adjacent to the second electrode 4018 across from the sixth electrode 4012. The eighth electrode 4006 is located on the first side of the resonator 4002 adjacent to the first electrode 4008 and across from the fifth electrode 4014.

The sixth 4012 and seventh 4020 electrodes correspond in position to a third anti-node of the vibration of the vibrating plate 4002 that has the same phase as the first anti-node. The fifth 4014 and eighth 4006 electrodes correspond in position to a fourth anti-node of the vibration of the vibrating plate that ha. The same phase as the second anti-node.

In operation the resonator 4000 serves as a frequency selective positive feedback element in the feedback signal path of the oscillator 4200. The resonator 4000 sets the frequency of the oscillator at the frequency corresponding to the mode of vibration of the vibrating plate 4002 that has anti-nodes positioned consistent with the positioning and phasing of the electrodes 4006–4002.

While the preferred and other embodiments of the invention have been illustrated and described, it will be clear that the invention is not so limited. Numerous modifications, changes, variations, substitutions, and equivalents will occur to those of ordinary skill in the art without departing from the spirit and scope of the present invention as defined by the following claims.

What is claimed is:

1. An electromechanical resonating device comprising:
    a first support member;
    a selectively doped vibrating member that is capable of resonating in a vibrational mode that has a first node and is attached to the first support at a position of the first node, the selectively doped vibrating member including;
        a first doped conducting region extending from the first support; and
        an insulating region;
    the selectively doped vibrating member comprising a body of single crystal semiconductor material;
    the support comprising a top layer of single crystal semiconductor material that is contiguous with the body of single crystal semiconductor material; and
    the support being contiguous with a portion of single crystal silicon that overlies a lower layer of silicon di-oxide.

2. The electromechanical resonating device according to claim 1, whereins:
    the selectively doped vibrating member comprises a beam shaped member having a first end, and a second end, a first longitudinal side extending between the first end and the second end, and a second longitudinal side extending between the first end and the second end.

3. The electromechanical resonating device according to claim 2 wherein:
    the selectively doped vibrating member is capable of resonating in a vibrational mode that includes the first node and a second node; and
    the resonating device further comprises a second support attached at the second node.

4. The electromechanical resonating device according to claim 3 wherein:
    the first doped conducting region extends from the first support to the second support.

5. The electromechanical resonating device according to claim 3 wherein:
    the first support is attached to the first longitudinal side;
    the second support is attached to the second longitudinal side; and
    the device further comprises:
        a third support attached to the second longitudinal side at the first node; and
        a fourth support attached to the first longitudinal side at the second node.

6. The electromechanical resonating device according to claim 2 wherein:
    the first node is located at approximately a center of the beam shaped member;
    the first support is attached at approximately a center of the first longitudinal side of the beam shaped member; and
    the first doped conducting region extends from the first support towards the first end of the beam shaped member; and
    the resonating device further comprises:
        a second support attached at approximately the center of the second longitudinal side of the beam shaped member; and
        a second doped conducting region extending from the second support toward the second end of the beam shaped member; and
        an insulating region between the first doped conducting region and the second doped conducting region.

7. The electromechanical resonating device according to claim 6 wherein:
    the selectively doped vibrating member is capable of resonating in a vibrational mode that includes the first node, a second node, and a third node; and the resonating device further comprises;
a third support attached to the beam at the second node;
a fourth support attached to the beam at the third node.

8. The electromechanical resonating device according to claim 7 wherein:
the first doped conducting region extends from the first support to the third support; and
the second doped conducting region extends from the second support to the fourth support.

9. An electromechanical resonating system comprising:
a vibrating member that is capable of resonating in a vibrational mode that includes a first anti-node characterized by a first relative phase and a second anti-node characterized by a second relative phase that is opposite to the first phase;
a first electrode positioned in a vicinity of the first anti-node;
a second electrode positioned in a vicinity of the second anti-node; and
an electric circuit including:
a differential amplifier having:
a first differential input coupled to the first electrode; and
a second differential input coupled to the second electrode.

10. The electromechanical resonating system according to claim 9 wherein:
the first electrode comprises:
a first selectively doped region of the vibrating member.

11. The electromechanical resonating system according to claim 10 wherein:
the second electrode comprises:
a second selectively doped region of the vibrating member.

12. The electromechanical resonating system according to claim 9 wherein:
the vibrating member comprises:
a beam capable of vibrating in a flexural mode having at least two anti-nodes, and one or more nodes.

13. The electromechanical resonating system according to claim 12 wherein:
a longitudinal coordinate of a center of gravity of the beam corresponds to a position of one of the one or more nodes.

14. The electromechanical resonating system according to claim 12 further comprising:
one or more supports coupled to the beam at each of the one or more nodes.

15. An electromechanical resonating system comprising:
a vibrating member that is capable of resonating in a vibrational mode that includes a first anti-node characterized by a first relative phase and a second anti-node characterized by a second relative phase that is opposite to the first phase;
a first electrode positioned in a vicinity of the first anti-node;
a second electrode positioned in a vicinity of the second anti-node; and
the vibrating member comprises a beam capable of vibrating in a flexural mode having an even number of anti-nodes including a first plurality of anti-nodes characterized by the first phase, and a second plurality of anti-nodes characterized by the second phase;
a first set of electrodes each positioned in a vicinity of one of a set of the first plurality of anti-nodes; and an electric circuit including:
a first input coupled to the first set of electrodes.

16. The electromechanical resonating system according to claim 15 further comprising:
a second set of electrodes each positioned in the vicinity of one of a set of the second plurality of anti-nodes; and
a second input of the electric circuit coupled to the second set of electrodes.

17. An electromechanical resonating device comprising:
a first support member;
a selectively doped vibrating member that is capable of resonating in a vibrational mode that has a first node and is attached to the first support at a position of the first node, the selectively doped vibrating member including;
a beam shaped member having a first end, and a second end, a first longitudinal side extending between the first end and the second end, and a second longitudinal side extending between the first end and the second end;
a first doped conducting region extending from the first support; and
an insulating region; and
wherein the first node is located at approximately a center of the beam shaped member;
the first support is attached at approximately a center of the first longitudinal side of the beam shaped member; and
the first doped conducting region extends from the first support towards the first end of the beam shaped member; and
the resonating device further comprises:
a second support attached at approximately the center of the second longitudinal side of the beam shaped member; and
a second doped conducting region extending from the second support toward the second end of the beam shaped member; and
an insulating region between the first doped conducting region and the second doped conducting region.

18. The electromechanical resonating device according to claim 17 wherein:
the selectively doped vibrating member is capable of resonating in a vibrational mode that includes the first node, a second node, and a third node; and
the resonating device further comprises;
a third support attached to the beam at the second node;
a fourth support attached to the beam at the third node.

* * * * *